(12) United States Patent
Ema

(10) Patent No.: US 6,504,741 B2
(45) Date of Patent: Jan. 7, 2003

(54) SEMICONDUCTOR DEVICE IN WHICH STORAGE ELECTRODE OF CAPACITOR IS CONNECTED TO GATE ELECTRODE OF FET AND INSPECTION METHOD THEREOF

(75) Inventor: Taiji Ema, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/984,779

(22) Filed: Oct. 31, 2001

(65) Prior Publication Data

US 2002/0141227 A1 Oct. 3, 2002

(30) Foreign Application Priority Data

Mar. 30, 2001 (JP) ........................................ 2001-100911

(51) Int. Cl.[7] .............................................. G11C 15/00
(52) U.S. Cl. ......................................... 365/49; 365/149
(58) Field of Search ............................ 365/51, 63, 149, 365/49

(56) References Cited

U.S. PATENT DOCUMENTS 4,780,848 A * 10/1988 Threewitt .................... 365/49
6,320,777 B1 * 11/2001 Lines et al. .................. 365/49
6,331,961 B1 * 12/2001 Kengeri et al. ............... 365/49
6,381,162 B1 * 4/2002 Peterson ...................... 365/49

OTHER PUBLICATIONS

Ser. No. 09/749,463, filed Dec. 28, 2000, Takeda et al.
Ser. No. 09/750,068, filed Dec. 29, 2000, Takeda et al.

* cited by examiner

Primary Examiner—Trong Phan
(74) Attorney, Agent, or Firm—Armstrong, Westerman & Hattori, LLP

(57) ABSTRACT

Each of cells disposed on a surface of a semiconductor substrate includes a first transistor and a second transistor. A second current terminal of the first transistor is connected to a gate terminal of the second transistor. A first current terminal of the first transistor is connected to a bit line. A gate terminal of the first transistor is connected to a word line. A first wiring is connected to a point in a circuit connected to the first current terminal of the second transistor. The bit line is set to a first voltage state or a second voltage state with a voltage higher than a voltage of the first voltage state. A voltage higher than the first voltage and lower than the second voltage is applied to the first wiring. A voltage detector circuit detects a voltage appearing on the second wiring.

20 Claims, 17 Drawing Sheets

FIG.1A
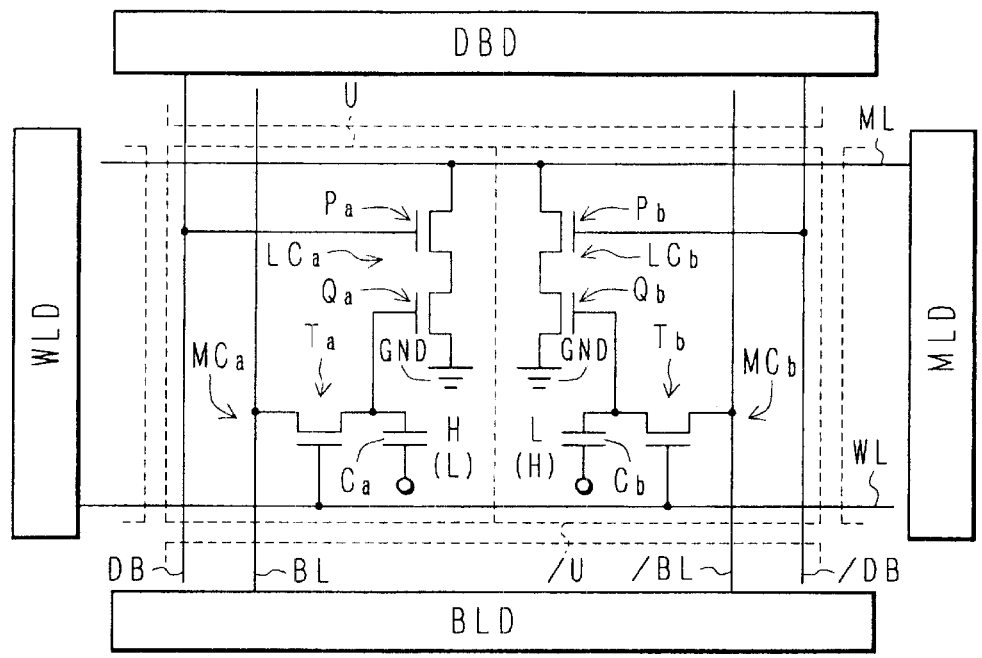
FIG.1B
| DRAM | H | L | H | L | L FOR BOTH |
|------|---|---|---|---|------------|
| DB | H | H | L | L | don't care |
| /DB | L | L | H | H | |
| ML | L | H | H | L | H |
FIG.1C
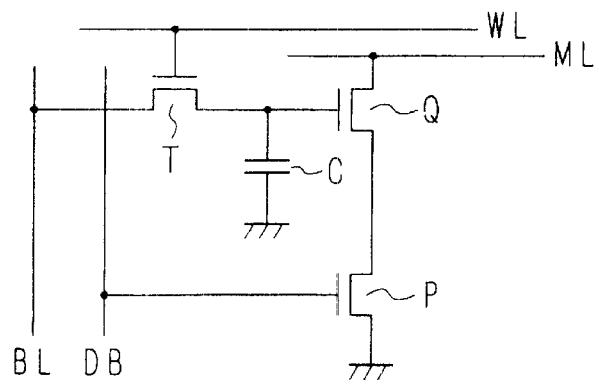

SEMICONDUCTOR DEVICE IN WHICH STORAGE ELECTRODE OF CAPACITOR IS CONNECTED TO GATE ELECTRODE OF FET AND INSPECTION METHOD THEREOF

BACKGROUND OF THE INVENTION

A) Field of the Invention

The present invention relates to a semiconductor device, and in particular, to a semiconductor device in which a storage electrode of a capacitor is connected to a gate electrode of a transistor.

B) Description of the Related Art

To implement a high-performance and high-speed information processing system, a content addressable memory (CAM) has attracted attention. In the CAM, a matching state between the memory contents stored in a memory cell and a signal supplied from an external device can be detected by a logical cell. The memory cell ordinarily includes a static random access memory (SRAM).

The inventor of the present invention has proposed a CAM including a dynamic random access memory (DRAM) in the memory cell. In the structure, even when a complementary signal is to be memorized, the basic unit of the memory cell includes two access transistors, two capacitors, and four search/compare transistors (for 3-valued CAM). However, a suitable driving technique and a suitable testing technique for the CAM have not been established yet.

SUMMARY OF THE INVENTION

It is therefore an object of the present invention to provide a semiconductor device capable of efficiently drive a circuit in which a storage electrode of a capacitor is connected to a gate electrode of a transistor.

Another object of the present invention to provide a semiconductor device and an inspection method capable of inspecting with high precision a circuit in which a storage electrode of a capacitor is connected to an impurity diffusion region of a surface layer of a semiconductor substrate and a gate electrode of a transistor.

According to one aspect of the present invention, there is provided a semiconductor device, comprising: a semiconductor substrate; a plurality of cells regularly disposed on one surface of said semiconductor substrate, each said cell including a first transistor and a second transistor, each of said first and second transistors including a first current terminal, a second current terminal, and a gate terminal for controlling a conduction state between said first and second terminals, said second current terminal of said first transistor being connected to said gate terminal of said second transistor; a bit line connected to said first current terminals of said first transistors of part of said cells; a word line connected to said gate terminals of said first transistors of part of said cells; a first wiring connected to a point in a circuit connected to said first current terminal of said second transistor of part of said cells; a second wiring connected to a point of a circuit connected to said second current terminal of said second transistor of each of cells selected from said cells; a bit line driver for setting said bit line to either one of a first voltage state and a second voltage state with a voltage higher than a voltage of the first voltage state; a first voltage generator circuit for generating a third voltage on said first wiring, said third voltage being higher than said first voltage and lower than said second voltage; a second voltage generator circuit for generating a fourth voltage on said second wiring, said fourth voltage being higher than said third voltage and equal to or lower than said second voltage; and a voltage detector circuit for detecting a voltage appearing on said second wiring.

With the bit line set to the first voltage, when the first transistor is turned on, the gate electrode of the second transistor is charged up to almost the first voltage. When the bit line is set to the second voltage state, the gate electrode of the second transistor is charged up to almost the second voltage. The third and fourth voltages are applied respectively via the first wiring and the second wiring respectively to the first and second current terminals of the second transistor. When the gate electrode of the second transistor is in the second voltage state, since the third voltage is higher than the first voltage, the gate leakage current can be lowered when compared with a case in which the first voltage is applied via the first wiring to the first current terminal of the second transistor. This enhances the retention characteristic of charge stored in the gate electrode.

According to one aspect of the present invention, there is provided a semiconductor device, comprising: a semiconductor substrate; a first transistor formed on a surface of said semiconductor substrate, said first transistor including a first gate electrode, a first impurity diffusion region, and a second impurity diffusion region; said first and second impurity diffusion regions being formed in a surface layer of said semiconductor substrate respectively on both sides of said first gate electrode; a signal line for selectively applying either one of a first voltage and a second voltage to said first impurity diffusion region; a control line for applying a control signal to the first gate electrode of said first transistor, said control signal controlling a conduction state of said first transistor; a second transistor formed on a surface of said semiconductor substrate, said second transistor including a second gate electrode connected to said second impurity diffusion region, a third impurity diffusion region, and a fourth impurity diffusion region; said third and fourth impurity diffusion regions being formed in a surface layer of said semiconductor substrate respectively on both sides of said second gate electrode; and a voltage generator circuit for generating, in an ordinary operation, a third voltage on said third impurity diffusion region and for applying, in an inspection, a fourth voltage to said third impurity diffusion region; each of said third and fourth voltages being between said first voltage and said second voltage; a voltage difference between said first and fourth voltages and a voltage difference between said second and fourth voltages are each larger than a smaller one of a voltage difference between said third voltage and said first voltage and a voltage difference between said third voltage and said second voltage.

When the circuit is set to the voltage applied state in the inspection, the gate leakage current of the second transistor can be reduced. The magnitude of the junction leakage current flowing from the second gate electrode via the second impurity diffusion region to the substrate can be easily inspected.

According to one aspect of the present invention, there is provided a transistor inspection method of inspecting a semiconductor device, said semiconductor device comprising: a first transistor formed on a surface of a semiconductor substrate, said first transistor including a first gate electrode, a first impurity diffusion region, and a second impurity diffusion region; said first and second impurity diffusion regions being formed in a surface layer of said semiconductor substrate respectively on both sides of said first gate electrode; and a second transistor formed on a surface of said semiconductor substrate, said second transistor including a second gate electrode connected to said second impurity diffusion region, a third impurity diffusion region, and a fourth impurity diffusion region; said third and fourth impurity diffusion regions being formed in a surface layer of said semiconductor substrate respectively on both sides of said second gate electrode, wherein data are stored by storing charge via said first transistor to a gate electrode of said second transistor to set a voltage of said gate electrode of said second transistor to a first voltage or a second voltage, said semiconductor inspection method comprising the steps of: applying a voltage between said first voltage and said second voltage to said third impurity diffusion region of said second transistor and setting said fourth impurity diffusion region to a floating state; storing charge to said gate electrode of said second transistor via said first transistor to set said gate electrode to said first voltage; and inspecting a retention characteristic of charge stored in said gate electrode of said second transistor.

When the circuit is set to the voltage applied state in the inspection, the gate leakage current of the second transistor can be reduced. It is possible to inspect the charge holding or retention characteristic restricted by the magnitude of the junction leakage current flowing from the second gate electrode via the second impurity diffusion region to the substrate.

BRIEF DESCRIPTION OF THE DRAWINGS

The objects and features of the present invention will become more apparent from the consideration of the following detailed description taken in conjunction with the accompanying drawings in which:

FIGS. 1A and 1C are equivalent circuit diagrams of a CAM previously proposed by the present inventor, and FIG. 1B is a logical value table;

DETAILED DESCRIPTION OF THE PREFERRED EMBODIMENTS

Figure 2A:
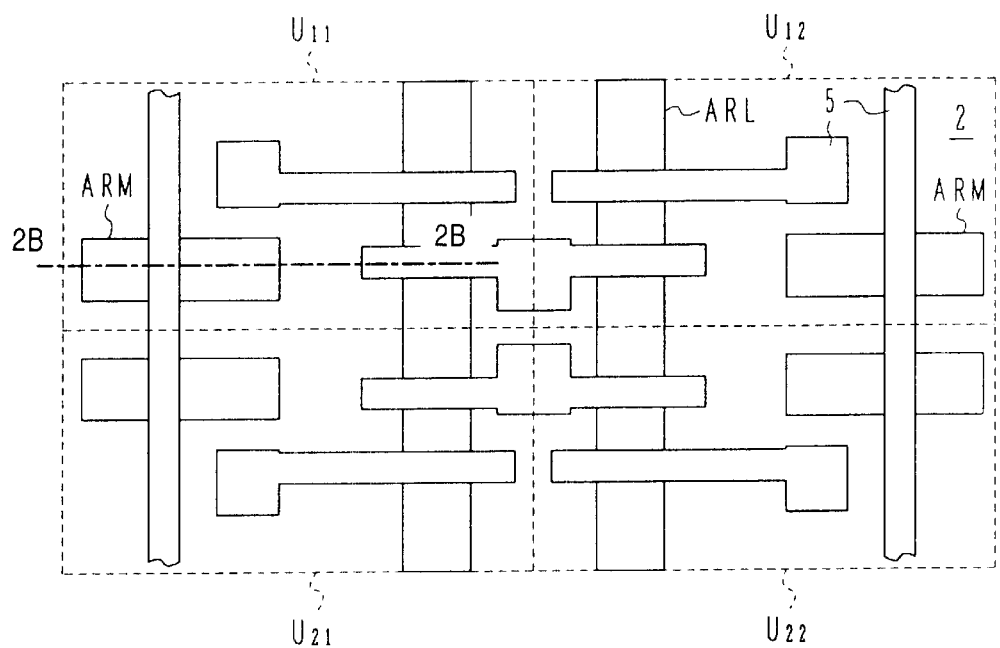
FIG. 2A is a plan view.

FIG. 1A shows an equivalent circuit of a CAM previously proposed by the inventor of this application. Repetitive units U and /U constitute one CAM unit (basic unit). The repetitive units /U and U are symmetric in configuration. A plurality of CAM units are arranged in a matrix form on a semiconductor substrate.

Complementary data is supplied to a bit line BL of a memory cell MCa and a reverse bit line /BL of a memory cell MCb. Transfer transistors Ta and Tb are turned on and off by signals applied to the same word line WL. Complementary data is written via the transfer transistors Ta and Tb respectively into capacitors Ca and Cb. To implement a don't-care state, data (data of state L, which will be described later) other than complementary data is supplied to the bit line BL and the reverse bit line /BL in some cases, which will be described later.

A series circuit of transistors Pa and Qa and a series circuit of transistors Pb and Qb constitute search/compare logical cells LCa and LCb, respectively. One of the terminals of the series circuit (one of the source and drain electrodes of each of the transistors Qa and Qb) is connected to a ground line GND. Other associated terminals (a source or drain electrode) of the transistors Pa and Pb respectively connected in series to the transistors Qa and Qb are connected to the same match line ML.

Potential of the storage electrodes of the capacitors Ca and Cb is applied respectively to gate electrodes of the transistors Qa and Qb of the logical circuit. Therefore, the on and off states of the transistors Qa and Qb of the logical circuit are controlled by the potential of the storage electrodes of the capacitors Ca and Cb, respectively. Gate electrodes of the transistors Pa and Pb are respectively connected to a data bus line DB and a reverse data bus line /DB. The data bus line DB and the reverse data bus line /DB transfer search data to be compared with data stored in the CAM unit.

As shown in FIG. 1C, the transistors P (Pa, Pb) and the transistors Q (Qa, Qb) may be positionally exchanged with each other.

In the search and compare operation, the match line ML is pre-charged to an H level, and an input signal and its complementary signal are respectively applied to the data bus line DB and the reverse data bus line /DB. One of the transistors Pa and Pb is turned on and the other one thereof is turned off. When the transistor Qa or Qb connected in series to the transistor Pa or Pb thus turned on is on, electric charge precharged to the match line ML is discharged to the ground line GND, and hence the potential of the match line ML changes. This indicates occurrence of "match" or "hit" between the search data and the stored data.

Even when the transistor Pa or Pb turns on, if the transistor Qa or Qb connected in series thereto is off, the electric charge of the match line ML is not discharged, and the match line ML is kept at the precharged potential. This indicates "mismatch" or "miss". That is, the potential change of the match line ML is controlled by the search/compare logical cell LCa or LCb connected to the memory cell (capacitor Ca or Cb) in the H state.

The bit line BL and the reverse bit line /BL are connected to a bit line driver circuit BLD, and the word line WL is connected to a word line driver circuit WLD. A data bus line DB and a reverse data bus line /DB are connected to a data bus line driver circuit DBD, and the match line ML is connected to a match line driver circuit MLD. The match line driver circuit MLD includes a sense amplifier for each match line ML. The sense amplifier detects a potential change of the match line ML. The data bus line driver circuit DBD may be a terminal itself to receive an external signal, a buffer circuit to temporarily store an external signal, or the like.

FIG. 1B shows a logical value table of the CAM of FIG. 1A. A DRAM field indicates information stored in the memory cell MCa, more specifically, a charged state of the capacitor Ca. The state, in which the storage electrode (the electrode connected to the gate electrode of the transistor Qa) of the capacitor Ca is charged to a high potential, corresponds to a high (H) state. The state, in which the storage electrode is charged to a low potential, corresponds to a low (L) state.

In four cases, excepting a case in the right-most column, of FIG. 1B, the capacitor Cb stores data complementary to data stored in the capacitor Ca. When the memory cell MCa is in an H state, the transistor Qa turns on and the transistor Qb turns off. Therefore, only when the transistor Pa connected in series to the transistor Qa in the on state is on, that is, only when the data bus line DB is in an H state, electric charge of the match line ML is discharged and hence the potential thereof is lowered. Resultantly, the match line ML is set to an L state.

When the memory cell MCa is in the L state, the transistor Qb turns on. Therefore, only when the transistor Pb connected in series to the transistor Qb in the on state is on, that is, only when the reverse data bus line /DB is in an H state, electric charge of the match line ML is discharged and hence the potential thereof is lowered. Resultantly, the match line ML is set to an L state. In any other cases, the match line ML is kept in the H state.

As indicated in the right-most column of FIG. 1B, when two memory cells MCa and MCb are both in an L state, the match line ML is kept in an H state regardless of the state of the data bus line DB. That is, the state of the data bus line DB is "don't care". In this way, a 3-valued logic can be implemented including the don't-care state.

Referring to FIGS. 2A to 10B, description will be given of processes to manufacture a CAM semiconductor device shown in FIG. 1A.

Figure 2B:
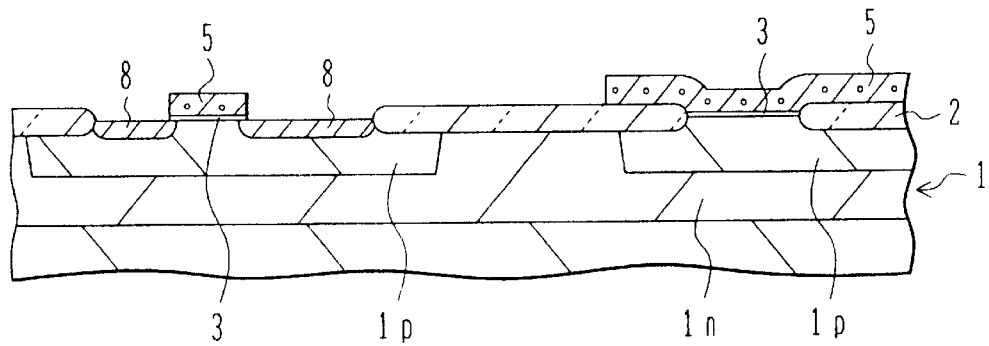
FIG. 2B is a cross-sectional view along 2B—2B, to explain a production method of a semiconductor device previously proposed.

FIGS. 2A and 2B shows a state in which an active region is defined on a semiconductor substrate and a gate electrode is formed on the active region with a gate oxide layer therebetween. FIG. 2A shows a plan view and FIG. 2B shows a cross-sectional view.

As shown in FIG. 2B, on a surface of a semiconductor substrate 1, an isolation insulator region 2 is formed with silicon oxide or the like by local oxidation of silicon (LOCOS) or shallow trench isolation (STI). A region on which the isolation insulator region 2 is not formed and in which the surface of the substrate 1 is exposed serves as the active region.

When necessary, an n-type well 1n, a p-type well 1p, and the like are formed on the silicon substrate 1. In FIG. 2B, since the p-type wells 1p respectively on the right and left sides are isolated from each other, hot electrons taking place during operation of a logical transistor does not reach a DRAM cell, which leads to an efficient characteristic of retention. It is also possible to collect both p-type wells into one well. In this case, although the retention characteristic is lowered, the region required for a cell can be minimized in size and hence the cell area becomes smaller.

For simplification, the well structure will not be shown in the drawings below. After a gate insulation film 3 of a silicon oxide layer is formed on a surface of the active region of the silicon substrate 1, a polycrystalline silicon layer is deposited thereon. By patterning the polycrystalline silicon layer, gate electrodes 5 (including signal lines) are formed. In the drawings below, the gate insulation films 3 is not shown.

After the gate electrodes 5 are formed, impurity ions are implanted into the active region, using a resist mask if necessary. As a result, a source/drain region 8 of a transistor as a memory element and a lightly doped source/drain region of a transistor as a logical element are formed.

In the plan view of FIG. 2A, logical element active regions ARL are formed in a central section to extend in a vertical direction. Formed on both sides thereof are memory element active regions ARM of which each has a horizontally elongated shape. On the logical element active regions ARL, gate electrodes 5 are formed to horizontally cross the active region. On the memory element active regions ARM, a gate electrode is formed to vertically cross the active region. The gate electrode extends on the isolation insulator region and serves as a wiring layer. FIG. 2A shows four repetitive units, i.e., U11, U12, U21, and U22. The repetitive units U11 and U21 and the repetitive units U21 and U22 are formed in an axially symmetric structure in a horizontal direction (the same layout in the left-half and right-half sections). The repetitive units U11 and U12 and the repetitive units U21 and U22 are formed in an axially symmetric structure in a vertical direction (the same layout in the upper-half and lower-half sections).

Figure 3A:
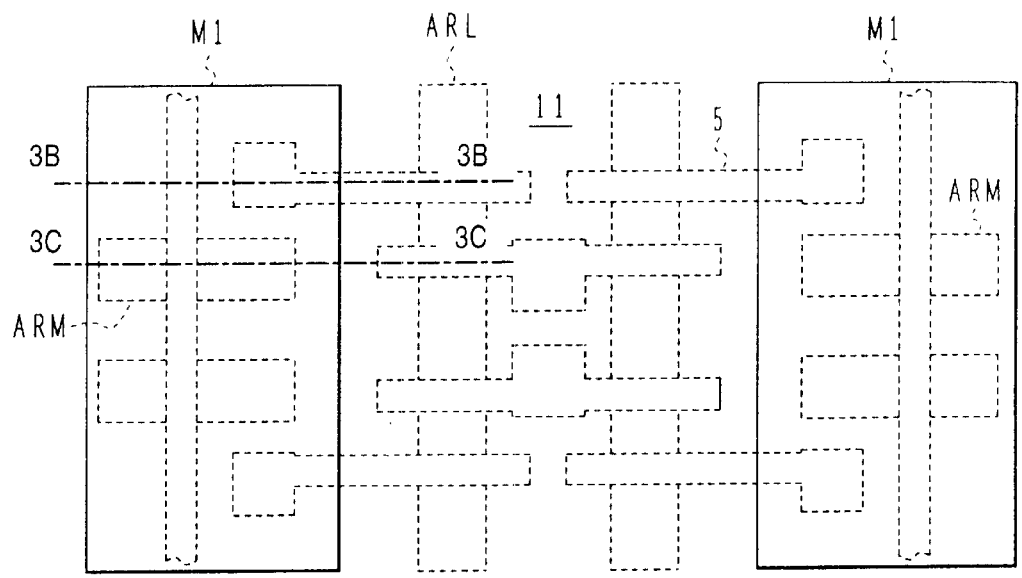
FIG. 3A is a plan view to explain a production method of a semiconductor device previously proposed.
Figure 3B:
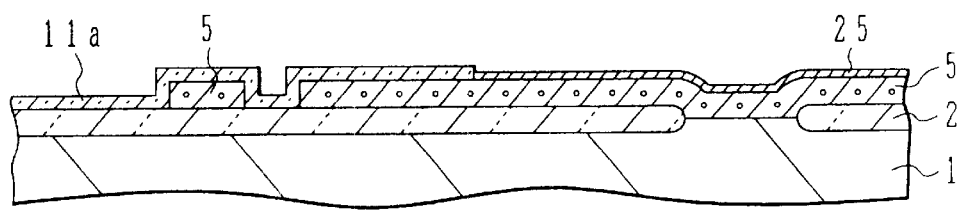
FIGS. 3B and 3C are cross-sectional views along 3B—3B and 3C—3C to explain a production method.
Figure 3C:
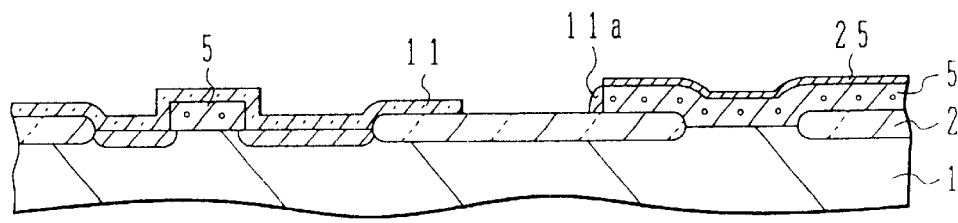

FIGS. 3A, 3B, and 3C shows processes in which on a silicon substrate 1, an insulation film of silicon oxide or the like covering gate electrodes is formed and part of the insulation film is removed for a silicide reaction.

As shown in FIG. 3A, a silicon oxide film 11 is deposited on the overall surface of the silicon substrate to cover the gate electrodes. Formed on the silicon oxide film 11 is a mask M1 of photo resist or the like. The mask M1 covers memory element regions, leaving logical element regions exposed. In this state, the silicon oxide film 11 is anisotropically etched. In the regions covered with the mask M1, the silicon oxide film 11 remains. In the logical element regions exposed in the openings of the mask M1, the silicon oxide film 11 on the flat surface is removed, and a sidewall spacer 11a remains on a sidewall of each gate electrode.

FIG. 3C shows the sidewall spacer 11a formed on a sidewall of the gate electrode 5.

After the sidewall spacer 11 is formed, impurity ions are implanted into the silicon substrate 1 to form highly doped source/drain regions of transistors in the logical element regions. The transistors in the logical element regions are formed in the lightly doped drain (LDD) structure. Thereafter, the mask M1 is removed.

To fabricate a complementary metal oxide semiconductor (CMOS) transistor, the mask M1 is removed after the sidewall spacer is formed. Photo resist is coated and a photo resist pattern having openings for an n-channel MOS (NMOS) of the logical element region is formed. By implanting n-type impurity into the substrate with high impurity concentration, an $n^+$-type source/drain region is formed. The photo resist pattern is then removed, and photo resist is again coated over the substrate to form a photo resist pattern with an opening for a p-channel MOS (PMOS). By implanting $BF_2$ ions into the substrate, a $p^+$-type source/drain region is formed. The photo resist pattern is then removed.

A cobalt (Co) layer is formed on the overall surface of the silicon substrate by sputtering. After the Co layer is formed, the substrate is annealed using RTA or the like to cause a silicide reaction for the Co film and the underlie silicon surface. A silicide layer 25 is resultantly formed on a surface of the gate electrode 5. The silicide film is also formed on the logical element active region ARL shown in FIG. 3A.

In place of the silicon oxide film, a silicon nitride film may also be used as the film to form the sidewall spacer.

Figure 4A:
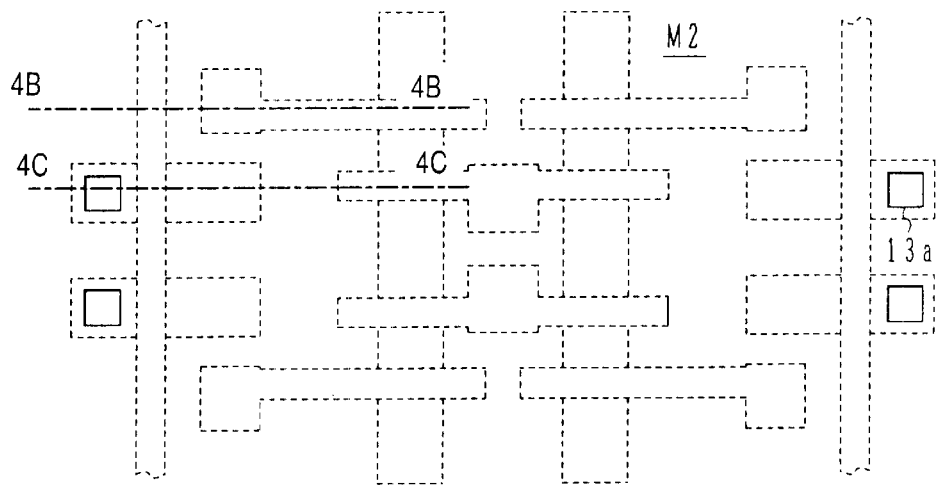
FIG. 4A is a plan view to explain a production method of a semiconductor device previously proposed.
Figure 4B:
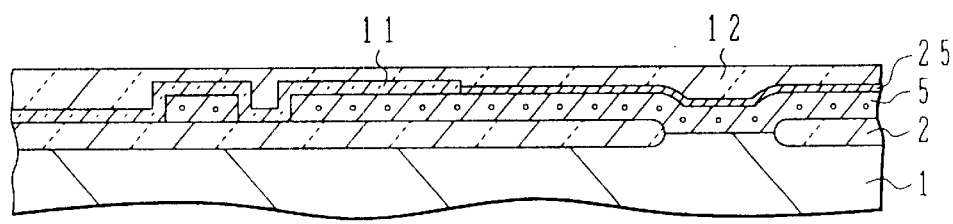
FIGS. 4B and 4C are cross-sectional views along 4B—4B and 4C—4C to explain a production method.

As shown in FIG. 4B, an insulation film 12 of borophosphosilicate glass (BPSG) serving as an inter-layer insulation layer is formed on the overall surface of the substrate 1 to cover the silicon oxide layer 11 and the silicide layer 25. A resist layer is coated on a surface of the insulation layer 12 to form a mask M2 having openings to form contact holes.

FIG. 4A is a plan view showing opening sections of the mask M2. The mask M2 has an opening 13a in a bit line contact section of the memory element region.

Figure 4C:
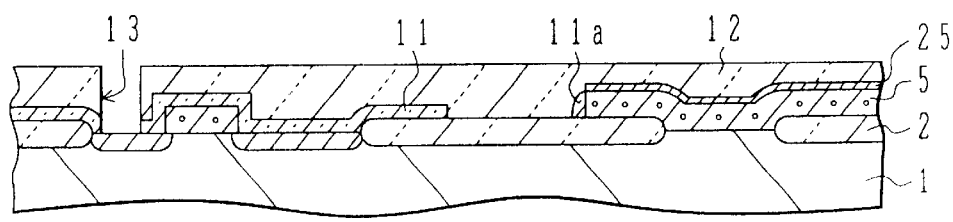

FIG. 4C shows a state in which an opening 13 is formed in the insulation layer 12 using the mask M2.

After the insulation layer 12 is formed, it is desirable to flatten the surface by reflow, chemical mechanical polishing (CMP), and the like.

Figure 5A:
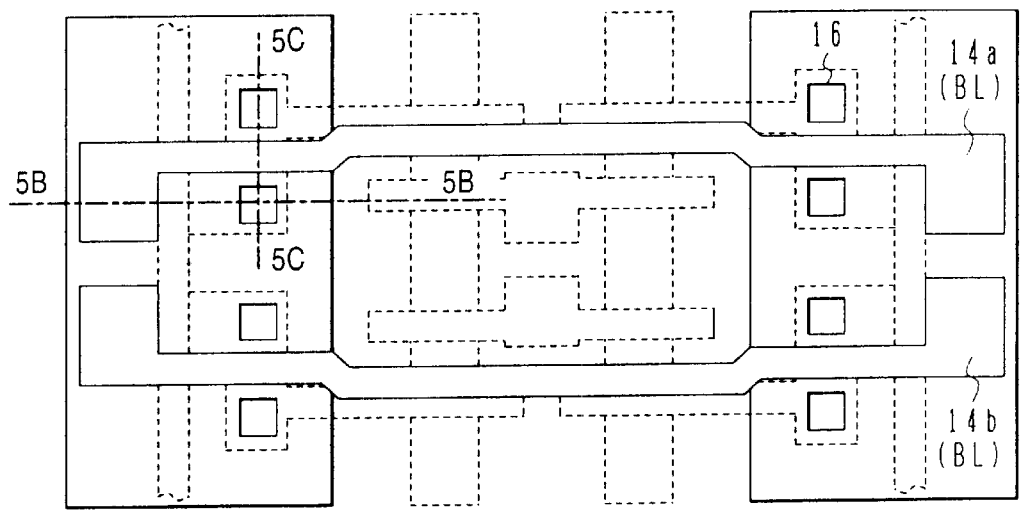
FIG. 5A is a plan view to explain a production method of a semiconductor device previously proposed.
Figure 5B:
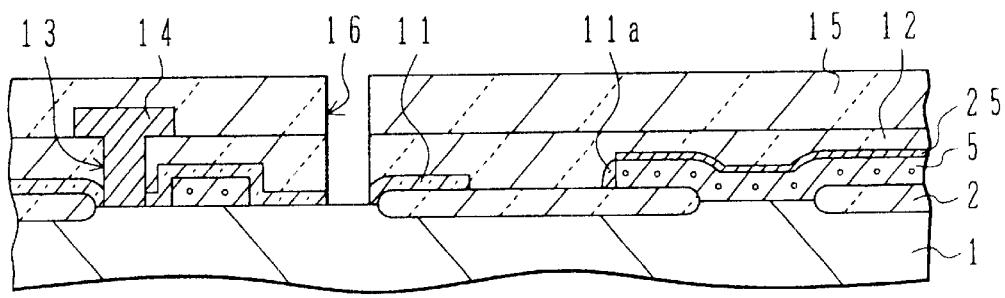
FIGS. 5B and 5C are cross-sectional views along 5B—5B and 5C—5C to explain a production method.

As can be seen from FIG. 5B, a conductive layer of, for example, a laminated layer of a polycrystalline silicon layer and a tungsten suicide (WSi) layer is formed on the insulation layer 12 such that the opening 13 is filled therewith. The conductive layer is patterned to form a wiring layer 14 to constitute a bit line BL and the like. The bit line BL extends along connection nodes of the logical transistors connected in series to each other. Therefore, the bit line can be formed sufficiently apart from a source/drain contact hole formed later for the logical element. This is an essential point to achieve high-speed operation by forming the match line (ML) and a data bus line (DB) with low-resistance metallic wiring, e.g. Al wiring.

Figure 5C:
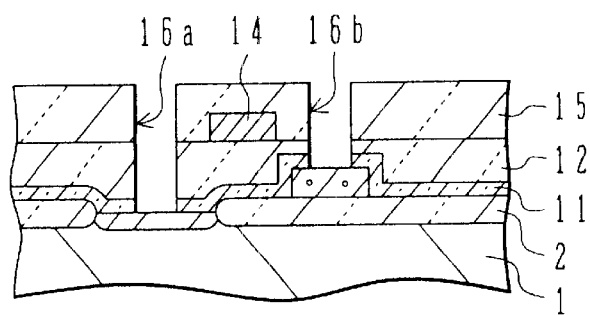

FIG. 5A shows a pattern in a plan view of bit lines 14a and 14b thus formed. As shown in FIGS. 5B and 5C, after the bit line 14 is formed, an insulation layer 15 serving as an inter-layer insulation layer is deposited on the insulation layer 12 to cover the bit line 14. A mask of photo resist or the like is formed on the insulation layer 15, which is then etched to form a contact hole 16 of a capacitor.

As shown in FIG. 5C, a contact hole 16a reaching the source/drain of the memory cell transistor and a contact hole 16b reaching the gate electrode of the logical element are disposed to sandwich the bit line 14 therebetween. By the construction in which the contact holes are formed to sandwich the bit line, the cell size is reduced in the horizontal direction of FIG. 5A. After the insulation layer 15 is formed, it is desirable to flatten the surface by reflow, chemical mechanical polishing (CMP), and the like.

Figure 6A:
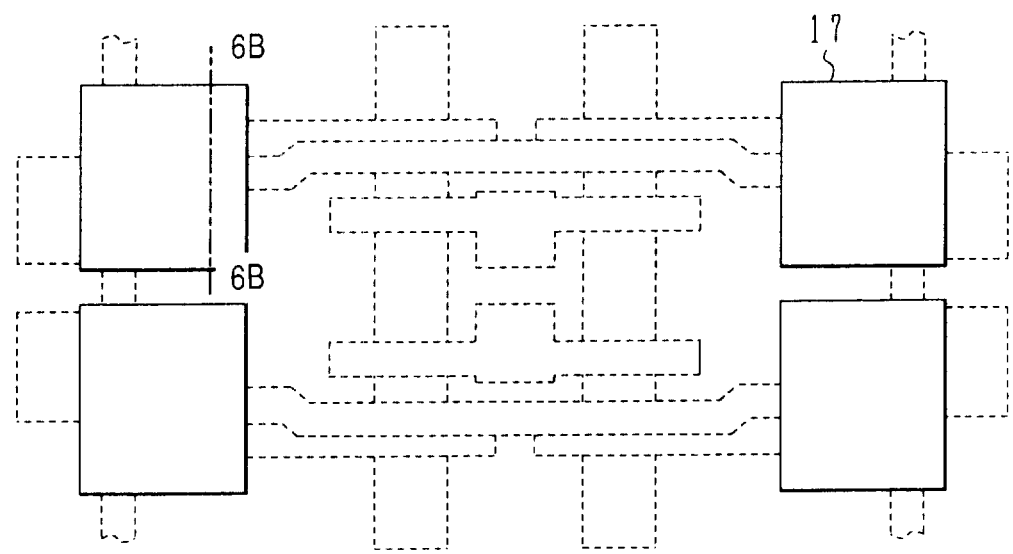
FIG. 6A is a plan view to explain a production method of a semiconductor device previously proposed.
Figure 6B:
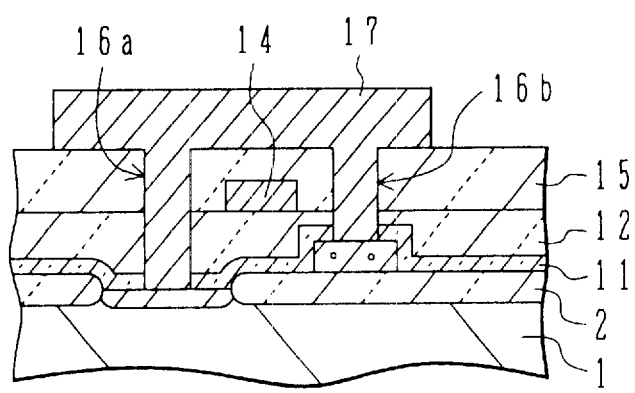
FIG. 6B is a cross-sectional view along 6B—6B to explain a production method.

As shown in FIG. 6B, a conductive layer of polycrystalline silicon or the like is deposited such that the contact holes 16a and 16b are filled therewith. Thereafter, a storage electrode 17 is formed by patterning the conductive layer.

As shown in FIG. 6A, the storage electrode 17 covers a primary section of the memory cell transistor and has a rectangular shape. Although a storage electrode of pillar-type is shown, the electrode may be formed in other shapes such as a cylinder shape. A large number of projections each of which has a semispherical shape may be formed on the surface to increase the surface area.

Figure 7A:
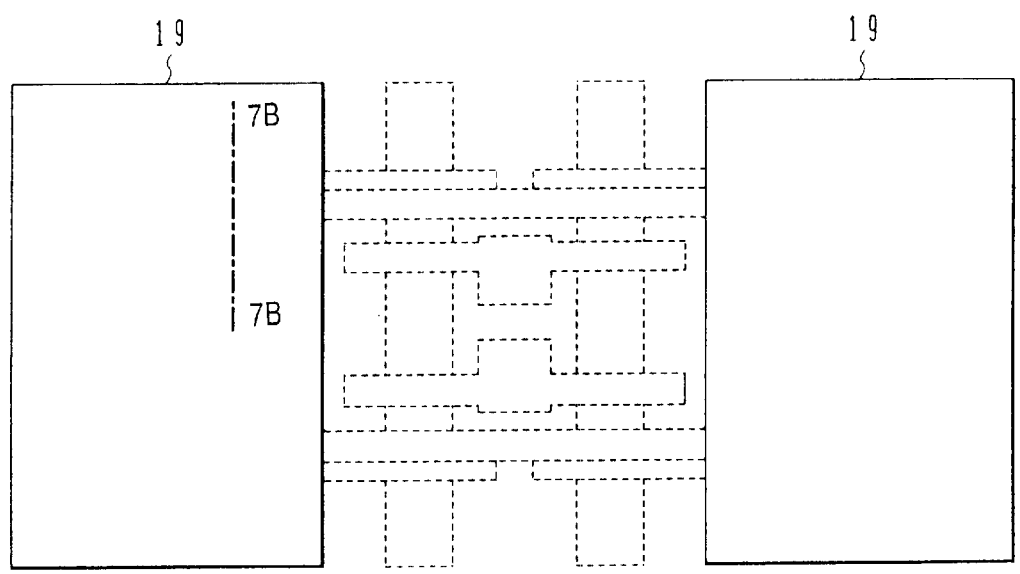
FIG. 7A is a plan view to explain a production method of a semiconductor device previously proposed.
Figure 7B:
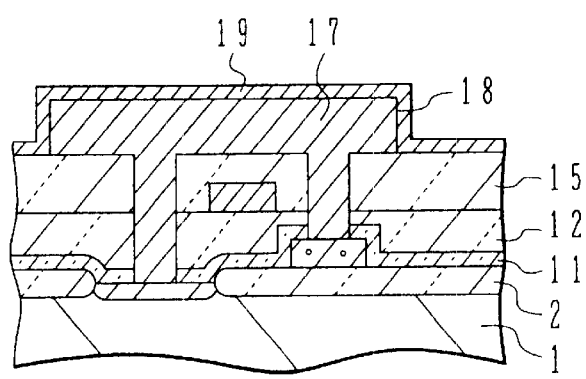
FIG. 7B is a cross-sectional view along 7B—7B to explain a production method.

As can be seen from FIG. 7B, after a capacitor dielectric layer 18 is formed over the storage electrode 17, a conductive layer serving as a cell plate electrode is formed. By patterning the conductive layer, a cell plate electrode 19 is formed.

As shown in FIG. 7A, the cell plate electrode 19 covers almost the overall surface of the memory element region. The cell plate electrode 19 extends to outside of the region shown and is kept at a predetermined potential (e.g., Vcc/2).

Figure 8:
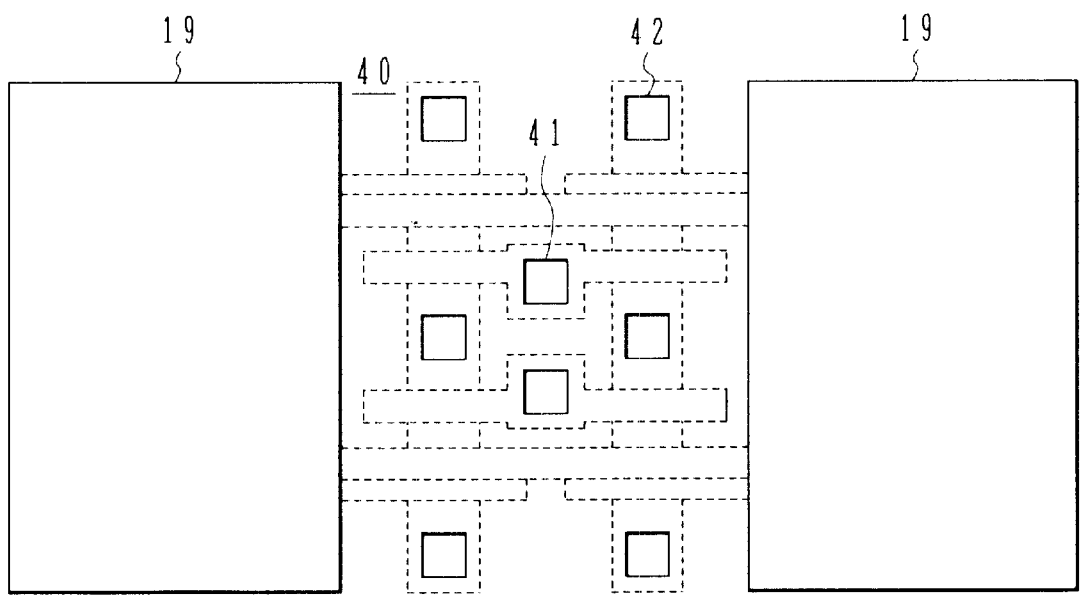
FIG. 8 is a plan view to explain a production method of a semiconductor device previously proposed.

As shown in FIG. 8, an insulation layer 40 serving as an inter-layer insulation layer is formed on the overall surface of the silicon substrate to cover the cell plate electrode 19, and then contact holes 41 and 42 are formed using a resist mask and the like.

Figure 9:
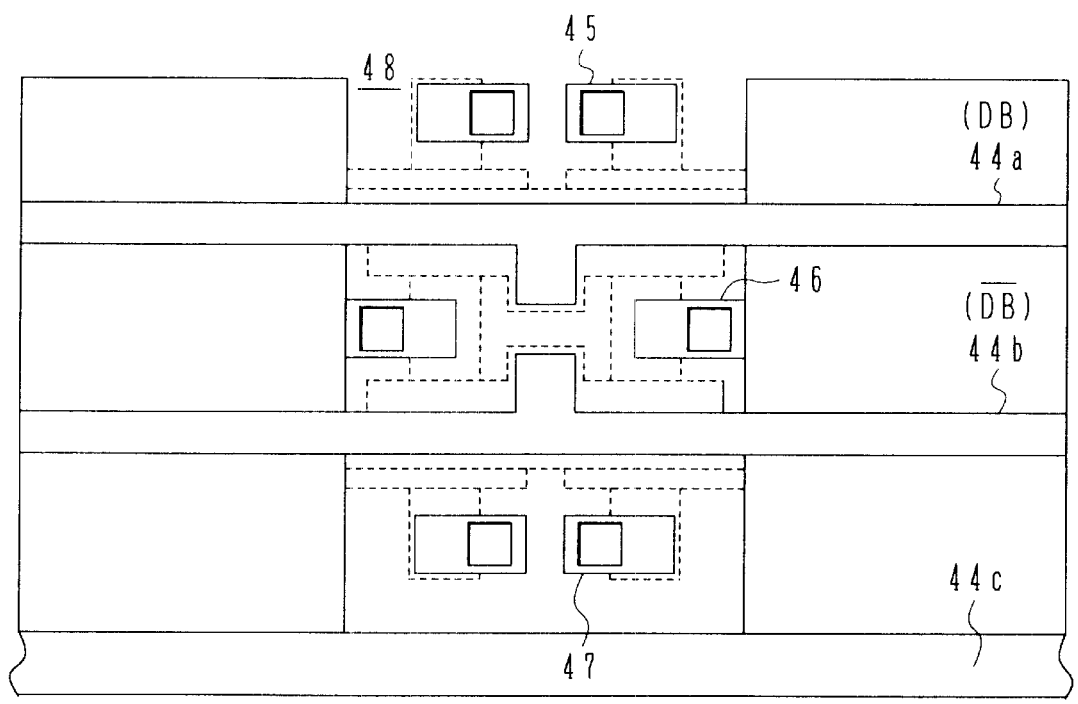
FIG. 9 is a plan view to explain a production method of a semiconductor device previously proposed.
Figure 9:
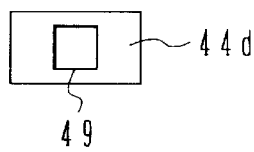
Figure 9:
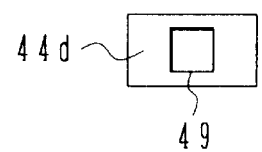

As can be seen from FIG. 9, a metallic wiring layer is formed on the silicon substrate such that the contact holes are filled therewith. By patterning the metallic wiring layer, there are formed data bus lines 44a and 44b and lead electrodes 45, 46, and 47 of source/drain regions of the logical element transistors. The electrodes 45 and 47 horizontally adjacent to each other extend in a direction therebetween decreases. The electrodes 46 horizontally adjacent to each other extend in a direction in which distance therebetween increases.

By this arrangement, the match line ML and the ground line GND can be disposed in the same wiring layer in the same direction. By disposing the data bus line DB in the first-wiring-layer (lower-wiring-layer) and the match line ML and the ground line GND in the second-wiring-layer (upper-wiring-layer), the arrangement of the contact holes 41 and 42 can be simplified. This reduces the area required for the logical circuit section.

As can be seen from the contact hole arrangement of FIG. 8, the contact holes 42 are arranged on both sides of the contact hole 41. The cell area is determined by how to dispose these wirings. This construction is optimal in consideration of this point.

It is favorable that a cell plate contact hole and a word line lead contact hole are also formed in advance so that a power source wiring 44c for contact of the cell plate electrode and a stack electrode 44d for a lead of a word line WL are simultaneously formed. For example, as shown in the upper and lower end sections of the cell block in FIG. 8, the power source wiring zone 44c is disposed to contact the cell plate. Between the cell blocks, a stack electrode 44d is disposed to contact the word line. The power source wiring to contact the cell plate may also be formed in the same wiring layer as the bit line.

An insulation layer 48 is then deposited serving as an inter-layer insulation film on the overall surface. It is favorable to flatten the surface of the insulation layer 48 by reflow, CMP, or the like. By forming a photo resist pattern on the insulation layer 48, a contact hole 49 is formed.

Figure 10A:
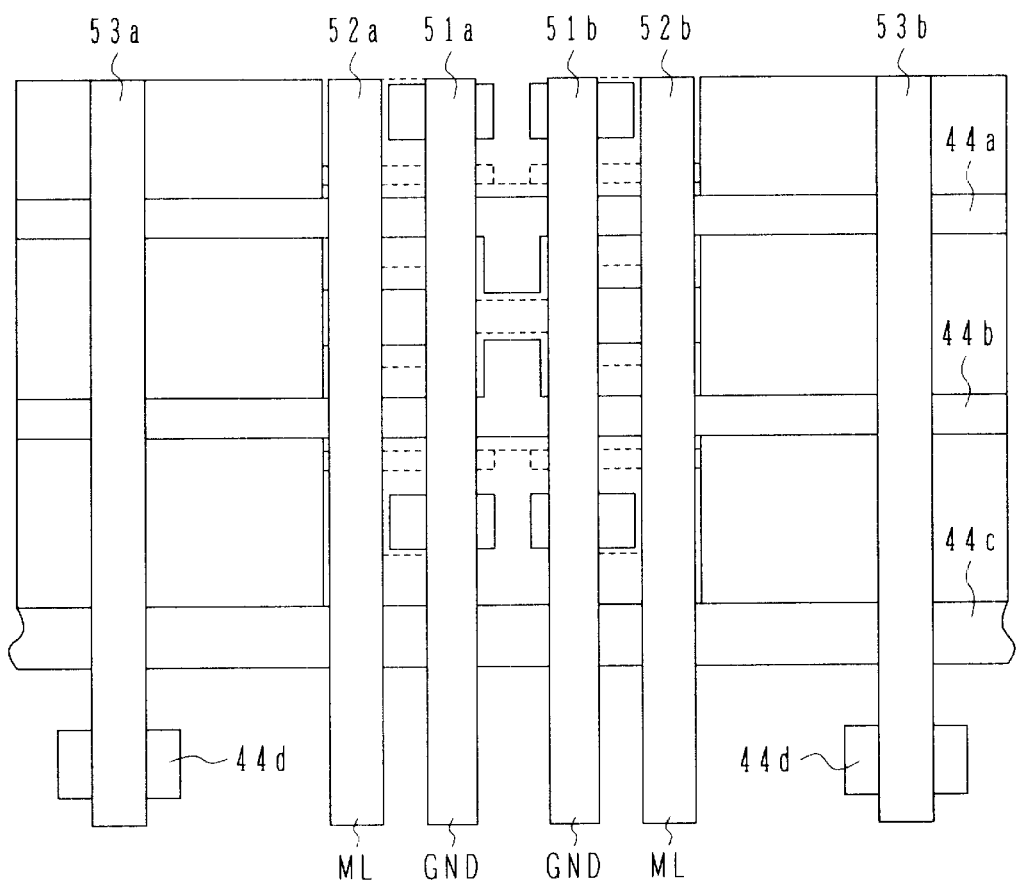
FIG. 10A is a plan view to explain a production method of a semiconductor device previously proposed.

As shown in FIG. 10A, an upper-layer metallic wiring layer is formed such that the contact hole is filled therewith. By patterning the metallic wiring layer, wiring 51a and 51b (to be collectively called wiring 51) and wiring 52a and 52b (to be collectively called wiring 52) are formed to extend in the vertical direction. The wiring 51a and 51b is, for example, the ground line. The wiring 52a and 52b are, for example, the match line. At the same time, lining (assist) wrings 53a and 53b for word lines are formed to line (assist) the word line via the lower stack electrode 44d. The word line is a wiring of polycrystalline silicon, polyside, or the like extending in the vertical direction in FIG. 10A. The word line has relatively high resistance. For example, the word line is connected to the metallic lining line between the respective cell blocks, the resistance can be considerably lowered.

Figure 10B:
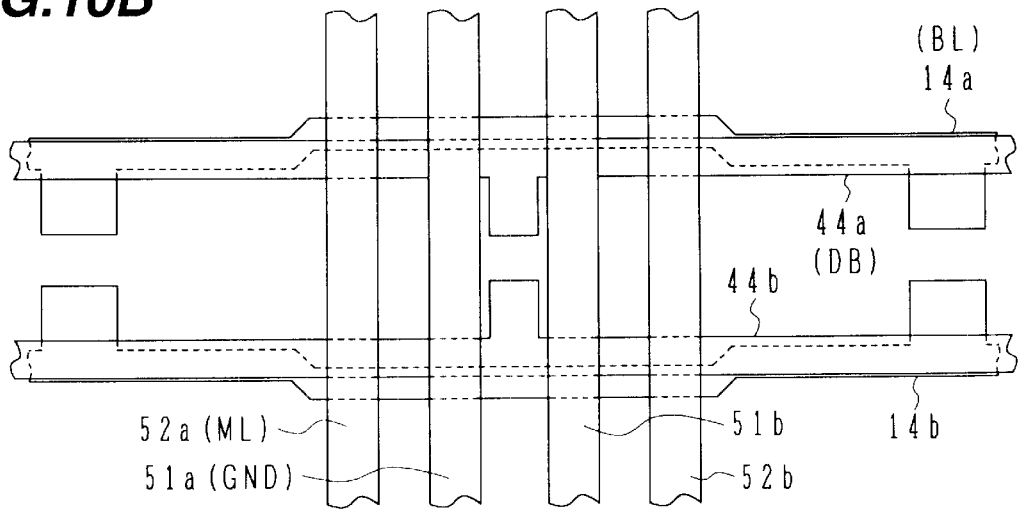
FIG. 10B is a plan view showing an electrode layout to explain the production method.

FIG. 10B shows a layout in a plan view of wiring formed at a level higher than that of the gate electrode (word line). First, bit lines BL (14a, 14b) are formed in the horizontal direction of FIG. 10B. On the bit lines BL, data bus lines 44a and 44b (and cell plate power wiring 44c) of a metallic wiring layer are formed to extend in the horizontal direction to overlap the bit lines BL. In a highest layer, a match line ML and a ground line GND (and word lining wiring for a word line) are formed extending in a direction substantially orthogonal to the bit lines BL and the data bus lines DB.

The logical element region is connected to the match line ML, data bus lines DB, and ground line GND which are formed using a metallic wiring layer, and hence can easily operate at a high speed.

The inventor has detected two problems of the CAM proposed above. The problems will be described.

The first problem takes place because the capacitor Ca of FIG. 1A is connected to the gate electrode of the transistor Qa. To increase performance of the transistor Qa and to decrease the cell area, the gate length of the transistor Qa is favorably reduced. To reduce the gate length, it is important to suppress the short channel effect and it is effective to thin the gate insulation film. However, when the gate insulation film of the transistor Qa is thinned, charge stored in the capacitor Ca easily leaks via the gate insulation film to the channel region of the transistor Qa. This deteriorate the data retention characteristic of the memory cell MCa.

Figure 11:
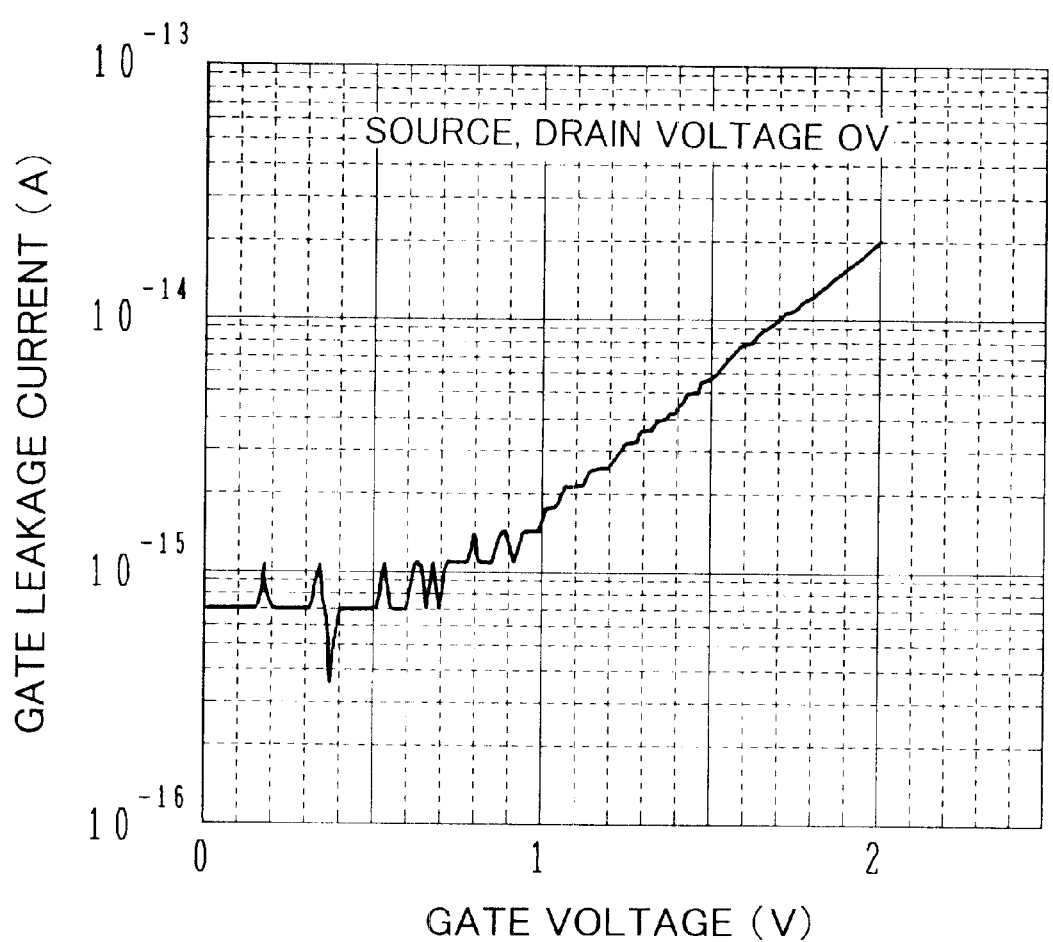
FIG. 11 is a graph showing a relationship between a gate leakage current and a gate voltage.

FIG. 11 shows a gate voltage dependence of the gate leakage current of a transistor having a gate oxide film thickness of 3.5 nm, a gate length of 0.18 µm, and a gate width of 0.36 µm. The source voltage and the drain voltage are both 0 V. The abscissa represents the gate voltage in a unit volt (V) and the ordinate represents the gate leakage current in a unit ampere (A). When the power source voltage is 1.8 V, the gate leakage current is slightly less than about 20 fA. Assume, for example, that a charge of 50 fC is stored in the capacitor Ca, and when a charge of 10 fC is discharged, the data readout operation cannot be conducted. The refresh time is then 500 ms. In consideration of deviation of the film thickness of the gate oxide film, it can be considered that the refresh time becomes short, about 100 ms.

The second problem appears because the storage electrode of the capacitor Ca is connected to the gate electrode of the transistor Qa and either one of the source and drain regions of the transistor Ta. Charge stored in the storage electrode of the capacitor Ca is discharged not only by a gate leakage current via the gate oxide film but also by a leakage current (junction leakage current) flowing through a pn junction of the source and drain regions.

Figure 12:
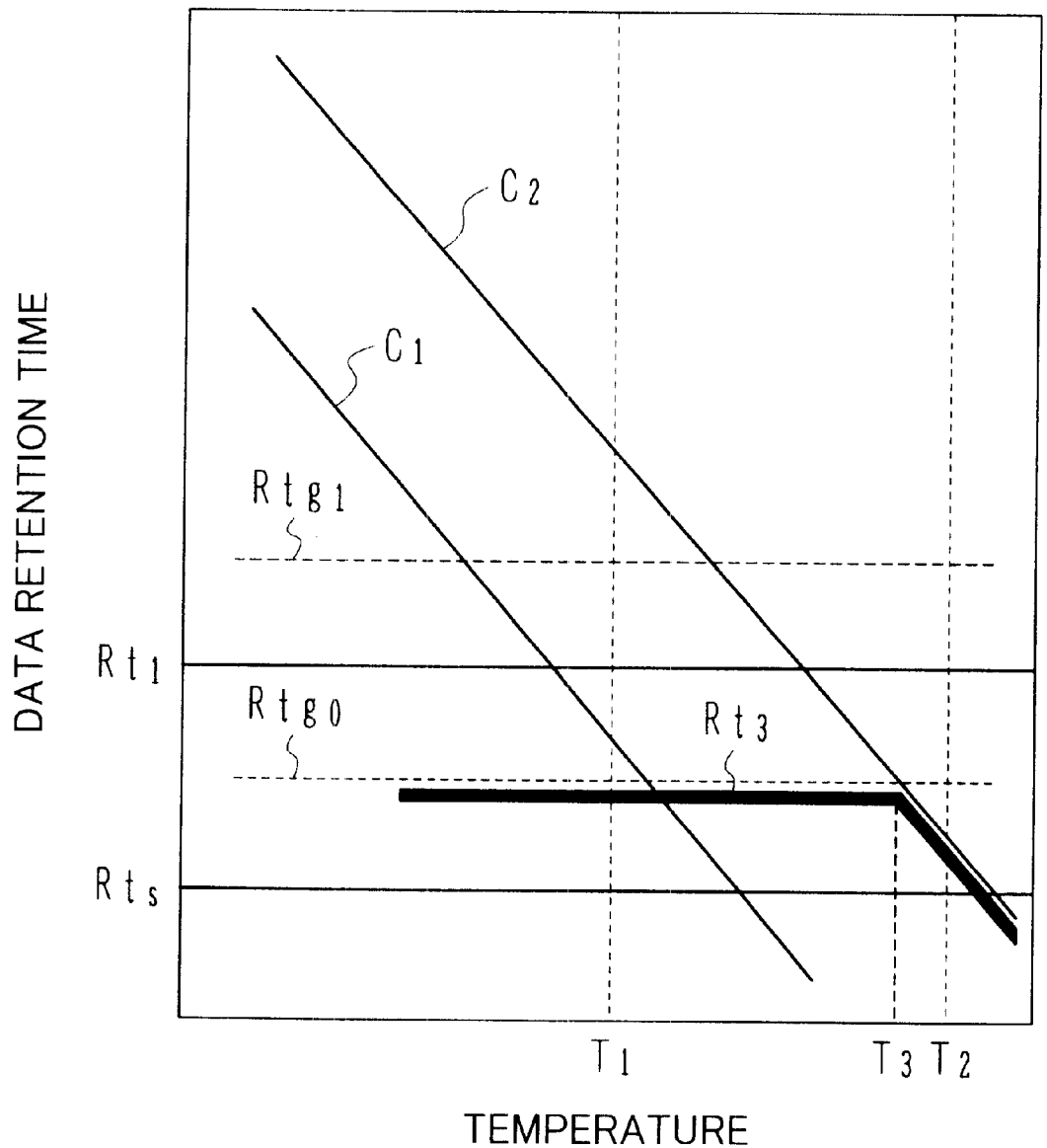
FIG. 12 is a graph showing temperature and data retention time caused by a gate leakage current and a junction leakage current.

FIG. 12 shows a relationship between data retention time and temperature in association with the gate and junction leakage currents. The abscissa represents the temperature and the ordinate represents the data retention time (corresponding to the refresh time). A broken line Rtg0 indicates data retention time associated with the gate leakage current. When the gate leakage current is reduced, the refresh time associated with the gate leakage current is elongated from Rtg0 to Rtg1 in the graph of FIG. 12. Intensity of the gate leakage current rarely depends on the temperature, and hence the data retention time Rtg0 and Rtg1 rarely depends on the temperature.

Real lines $C_1$ and $C_2$ respectively indicate data retention time of the cells $C_1$ and $C_2$ associated with the junction leakage currents. The junction leakage current remarkably depends on the temperature and considerably varies among the cells. The data retention time associated with the junction leakage current becomes shorter as the temperature becomes higher. For example, in a range lower than a temperature $T_3$ at which the broken line $RTg_0$ and the real line $C_2$ intersect with each other, the gate retention time is determined by the gate leakage current. In a range higher than the temperature $T_3$, the gate retention time is determined by the junction leakage current. Therefore, actual data retention time is indicated by a bold line $Rt_3$.

Assume that the operation guarantee temperature of the product is $T_2$. The temperature $T_2$ is, for example, 125° C. Assume that the temperature at testing of the product is $T_1$. The temperature $T_1$ is, for example, 90° C. Assume that the guarantee value of the data retention time of the product is Rts. The data retention time of the cell $C_1$ is equal to or less than the guarantee value Rts under a condition of the operation guarantee temperature $T_2$. Therefore, the cell $C_1$ must be rejected and repaired to a redundant cell in the testing. However, under the condition of the operation guarantee temperature $T_1$, the data retention time is equal to or more than the guarantee value Rts, the cell $C_1$ cannot be detected as a defective cell.

To detect the cell $C_1$ as a defective cell under the condition of the operation guarantee temperature $T_1$, the judge value of data retention time for a reference of rejection must be extended to $RT_1$. However, when the judge value is set to $RT_1$, a cell $C_2$ which must pass the inspection is rejected. That is, under the condition of the operation guarantee temperature $T_1$, it is impossible to discriminate the cell $C_1$ to be rejected from the cell $C_2$ to be accepted in the inspection.

Figure 13A:
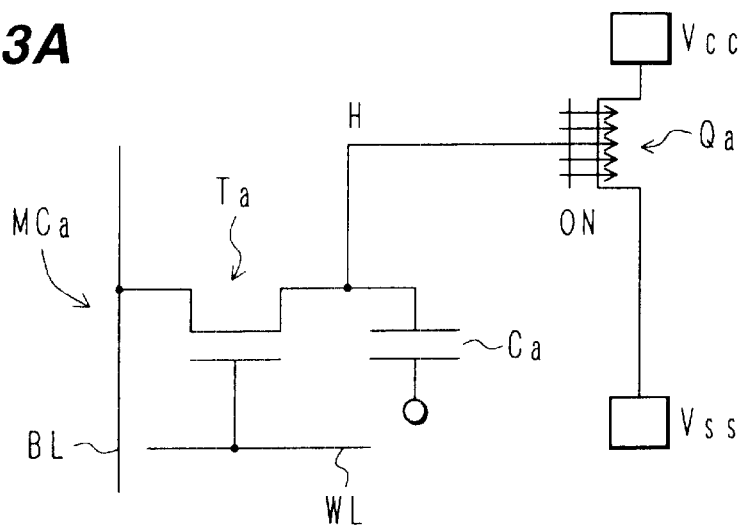
FIGS. 13A and 13B are equivalent circuit diagrams to explain causes of the gate leakage current in the prior art.
Figure 13B:
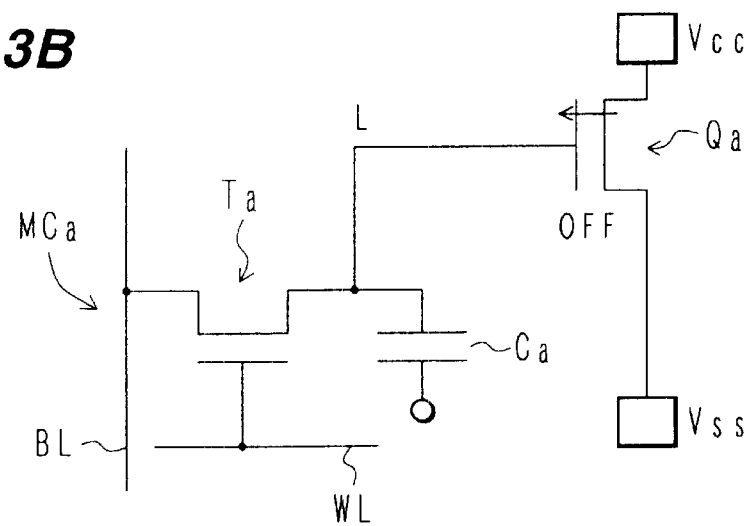

Next, description will be given of a first embodiment of the present invention which can solve the first problem. Referring now to FIGS. 13A and 13B, description will be given of a principle of the flow of gate leakage current in the CAM shown in FIG. 1.

FIG. 13A shows a case in which the memory cell MCa of FIG. 1A is in an H state. The drain region and the source region of the transistor Qa are connected to the power source voltage Vcc and the ground potential Vss, respectively. In this situation, an H-state voltage, namely, the power source voltage Vcc is applied to the gate electrode of the transistor Qa. The transistor Qa is turned on, and hence a channel is formed below the gate electrode. The source region of the transistor Qa is connected to the ground potential Vss, and hence a voltage between the gate electrode and the channel becomes substantially equal to the power source voltage Vcc. Therefore, a leakage current flows from all bottom surface of the gate electrode to the channel.

FIG. 13B shows a case in which the memory cell MCa is in an L state. The transistor Qa is in an off state. In this situation, when the match line ML of FIG. 1A is precharged, a voltage substantially equal to the power source voltage Vcc appears in the drain region of the transistor Qa. Therefore, in an overlapped region between the gate electrode and the drain region, a leakage current flows from the drain region to the gate electrode.

Figure 13C:
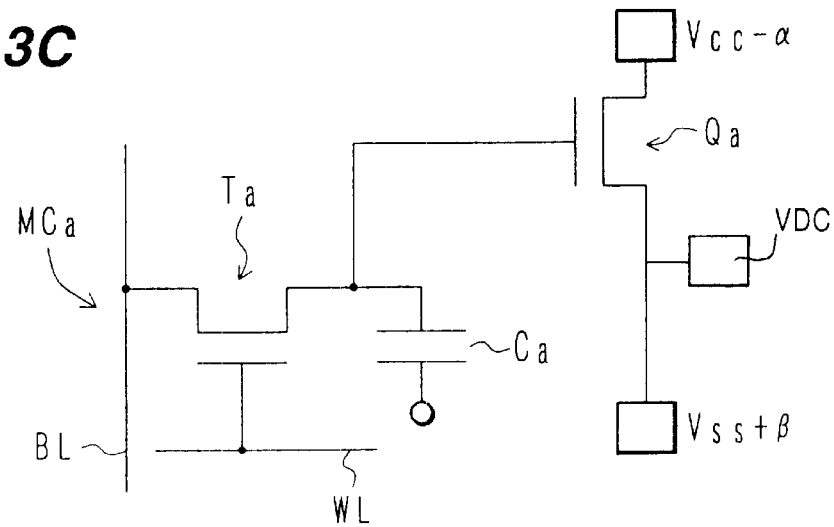
FIG. 13C is an equivalent circuit diagram showing a voltage state applied to a semiconductor device in a first embodiment.

FIG. 13C shows a case in which a voltage is applied to the CAM unit of the first embodiment. A voltage Vss+$\beta$ higher by $\beta$ than the ground potential Vss is applied to the source region of the transistor Qa. The voltage to precharge the match line ML of FIG. 1A is set to a voltage Vcc-a lower by a than the power source voltage Vcc.

Assume in the description below that the power source voltage Vcc is 1.8 V and the voltage $\beta$ is 0.45 V.

When the memory cell MCa is set to an H state, a voltage substantially equal to the power source voltage Vcc is applied to the gate electrode of the transistor Qa. In this situation, a potential difference of 1.35 V appears between the source region and the gate electrode. In contrast therewith, in the previously proposed case, the potential difference is 1.8 V as shown in FIG. 13A. As shown in FIG. 11, when the potential difference between the source region and the gate electrode lowers from 1.8 V to 1.35 V, the gate leakage current lowers from about 12 fA to about 4 fA.

When the memory cell MCa is set to an L state, a voltage substantially equal to the ground potential Vss is applied to the gate electrode of the transistor Qa. In this situation, a potential difference of Vcc-$\alpha$- Vss appears between the drain region and the gate electrode. When the power source voltage Vcc is 1.8 V, the ground potential Vss is 0 V, and the voltage a is 0.45 V, the potential difference between the drain region and the gate electrode becomes lower by 0.45 V than that of the previously proposed case shown in FIG. 13B. Therefore, the gate leakage current can be decreased.

While the leakage current flows from the overall bottom surface of the gate electrode when the memory cell MCa is in the H state, the leakage current flows only in the overlapped region between the gate electrode and the drain region when the memory cell MCa is in the L state. Therefore, the leakage current is larger in the H state than in the L state of the memory cell MCa. To lower the large leakage current, it is favorable to set the voltage $\beta$ to a value higher than the voltage a under a condition that a voltage Vcc-$\alpha$-$\alpha$ is higher than a voltage Vss+$\beta$.

Description will now be given of a condition favorable for effective leakage current decrease.

Assume that the gate leakage current is expressed as lLg. The current lLg is approximated as follows.

$$\log(ILg)=a(Vg/t_{ox})+b \tag{1}$$

In the expression, a and b are constants, Vg is a voltage between the gate electrode and the substrate, and $t_{ox}$ is film thickness of the gate insulating film.

As shown in FIG. 13A, when the memory cell MCa is in the H state, a voltage Vcc-Vss is applied between the gate electrode and the substrate. Assume the leakage current is $ILg_0$ in this situation. The following expression holds according to expression (1).

$$\log(ILg_0)=a((Vcc-Vss)/t_{ox})+b \tag{2}$$

In the embodiment, since the source voltage of the transistor Qa is increased by the voltage $\beta$, the voltage applied between the gate electrode of the transistor Qa and the substrate is Vcc–Vss–$\beta$. Assume the leakage current is $lLg_1$ in this situation. The following expression holds.

$$\log(ILg_1)=a((Vcc-Vss-\beta)/t_{ox})+b \tag{3}$$

The following expression is rendered from expressions (2) and (3).

$$\log(ILg_0/ILg_1)=(a/t_{ox})\beta \tag{4}$$

To set the gate leakage current $lLg_1$ to at most ½ of the gate leakage current $lLg_0$ of the prior art, it is only necessary to set the right term of expression (4) to at least log 2. According to the gradient of the graph of FIG. 11, $a/t_{ox}$ is about one. Therefore, it is only necessary to set $\beta$ to at least log 2, namely, at least 0.3 V.

Similarly, when the memory cell MCa is in the L state, it is favorable that a is at least 0.3 V.

The voltages $\alpha$ and $\beta$ are desirably set such that the gate leakage current $ILg_H$ when the memory cell MCa is in the H state is substantially equal to the gate leakage current $ILg_L$ when the memory cell MCa is in the L state. Next, description will be given of a condition under which the gate leakage current $ILg_H$ is equal to the gate leakage current $ILg_L$.

When the area of the region through which the gate leakage current flows is taken into consideration, the following expression holds.

$$\log(ILg)=a(S/t_{ox})Vg+b \tag{5}$$

In expression (5), S is an area of the region through which the gate leakage current flows. Assume that an overlapped region between the gate electrode and the active region is SGA and an overlapped region between the drain region and the gate electrode is $S_{GD}$. The gate leakage current flow through the region having an area of $S_{GA}$ when the memory cell MCa is in the H state as shown in FIG. 13A. The gate leakage current flow through the region having an area of $S_{GD}$ when the memory cell MCa is in the L state as shown in FIG. 13B. Therefore, the following expressions are rendered.

$$\log(ILg_H)=a(S_{GA}/t_{ox})(Vcc-Vss-\beta)+b$$

$$\log(ILg_L)=a(S_{GD}/t_{ox})(Vcc-\alpha-Vss)+b \tag{6}$$

According to a condition of $ILg_H=ILg_L$ and expression (6), the following expression is obtained.

$$S_{GA}/S_{GD}=(Vcc-\alpha-Vss)/(Vcc-Vss-\beta) \tag{7}$$

Ordinarily, $S_{GA}/S_{GD}$ ranges from about 5 to about 10. Therefore, the voltages $\alpha$ and $\beta$ need only set such that the right term of expression (7) ranges from about 5 to about 10.

Actually, when the voltages $\alpha$ and $\beta$ are set such that the right term of expression (7) ranges from (½)($S_{GA}/S_{GD}$) to 2($S_{GA}$/SGD), the gate leakage current can be efficiently lowered in both cases in which the memory cell MCa is the H state and in which the memory cell MCa is in the L state.

In the case of the embodiment, the operating voltage of the transistor Qa is Vcc–Vss–($\alpha$+$\beta$). Assume that the threshold voltages respectively of the PMOS and the NMOS constituting a sense amplifier in the match line driver circuit MLD are $Vth_P$ and $Vth_N$, the voltages $\alpha$ and $\beta$ are favorably set to satisfy the following expression.

$$Vcc-Vss-(\alpha+\beta)>|Vth_P|+Vth_N \tag{8}$$

Figure 14:
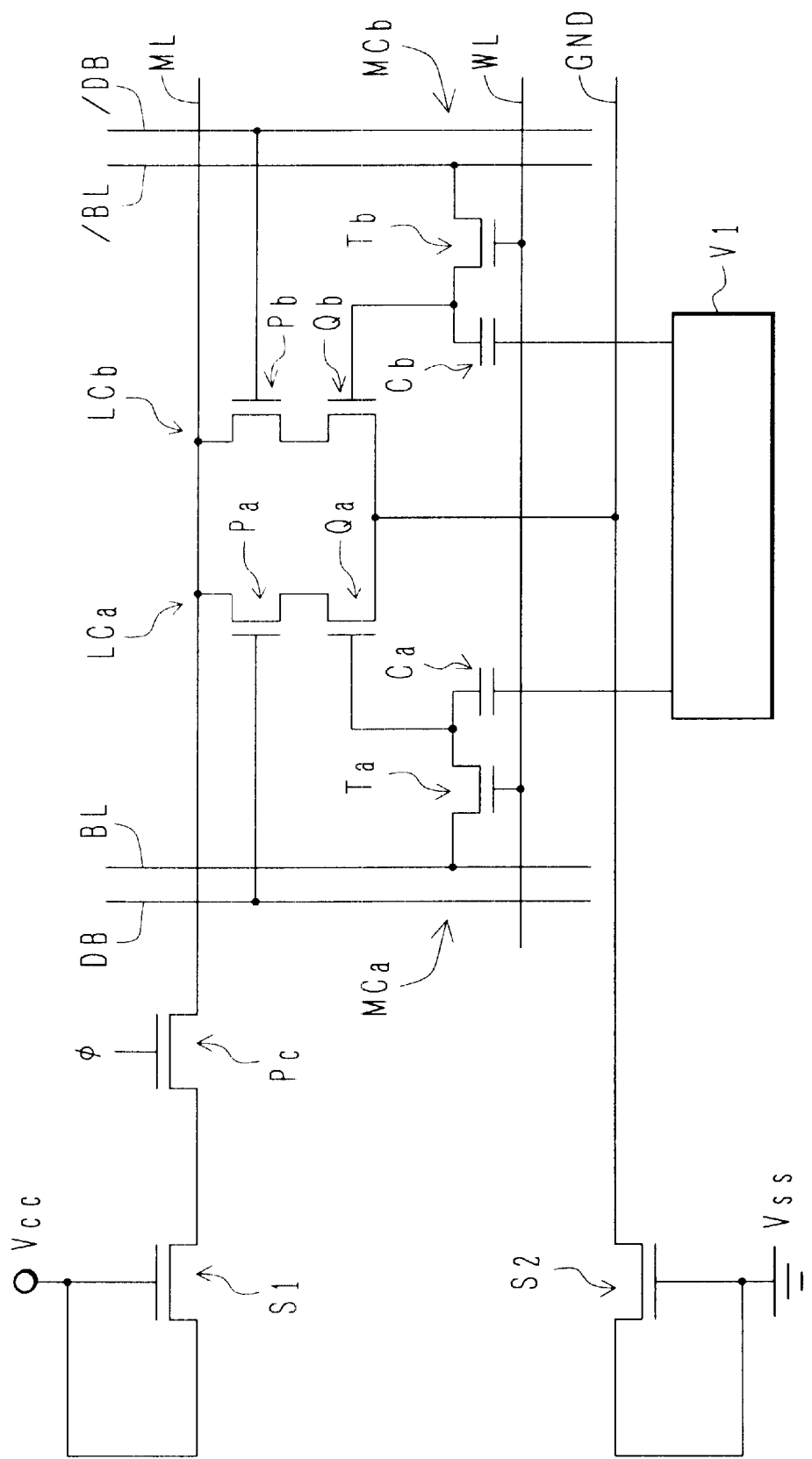
FIG. 14 is an equivalent circuit diagram of a semiconductor device in a first embodiment.

FIG. 14 shows an equivalent circuit to set the voltage state of FIG. 13C. The ground line GND is connected via a p-channel MOS transistor $S_2$ to the ground potential Vss. The ground potential Vss is applied to the gate electrode of the transistor $S_2$.

The match line ML is connected to the power voltage Vcc supply line via the transistor Pc and an n-channel MOS transistor $S_1$. The power voltage Vcc is applied to the gate electrode of the transistor $S_1$. By turning the transistor Pc on, the match line ML can be precharged. Applied to the gate electrode of the transistor Pc is a match line decode signal φ to select a match line ML.

The other configurations of FIG. 14 are almost the same as those of the equivalent circuit of FIG. 1A. Although not shown in FIG. 1A, a voltage of (Vcc+Vss)/2 is applied to the cell plate electrodes of the capacitors Ca and Cb from a (½)Vcc generator circuit $V_1$.

By setting the threshold voltage of the transistor $S_2$ to β, the voltage appearing on the ground line GND can be set to Vss+β. By setting the threshold voltage of the transistor $S_1$ to α, the voltage applied to the match line ML can be set to Vss−α. Strictly, the voltage applied to the match line ML is lowered by a voltage drop caused by the transistor Pc. The voltage applied to the drain region of the transistor Qa is lowered by a voltage drop caused by the transistor Pa as compared with the voltage of the match line ML.

In place of the transistors $S_1$ and $S_2$ of FIG. 14, constant-voltage drop elements of another structure may be used. It is also possible that the ground line GND is connected to a constant-voltage circuit to generate a voltage of Vss+β and the match line ML is connected a constant-voltage circuit to generate a voltage of Vss−α. For a circuit in which only one of the transistors $S_1$ and $S_2$ is connected as above, the advantage can be expected to some extent.

Figure 15A:
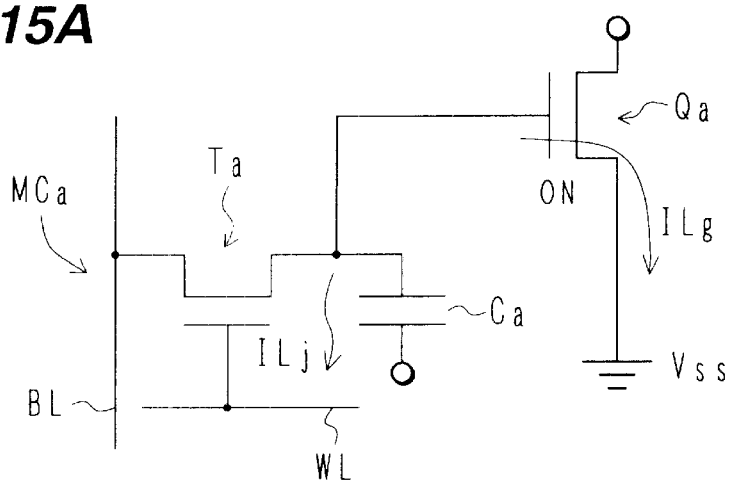
FIGS. 15A and 15B are equivalent circuit diagrams showing a state with applied voltages and a leakage current in an inspection of the prior art.
Figure 15B:
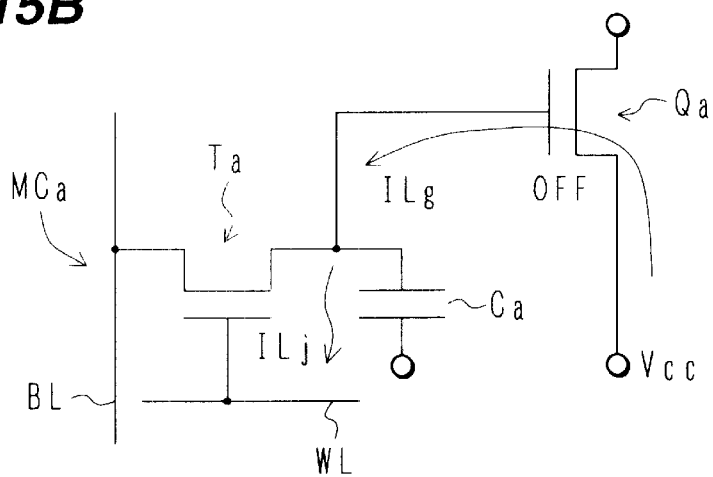
Figure 15C:
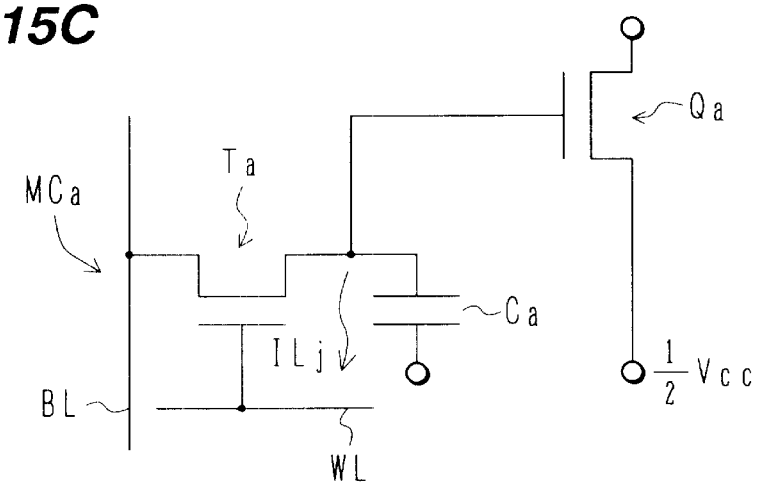
FIG. 15C is an equivalent circuit diagram showing a state of voltages applied to a semiconductor device of a second embodiment at inspection.
Figure 16:
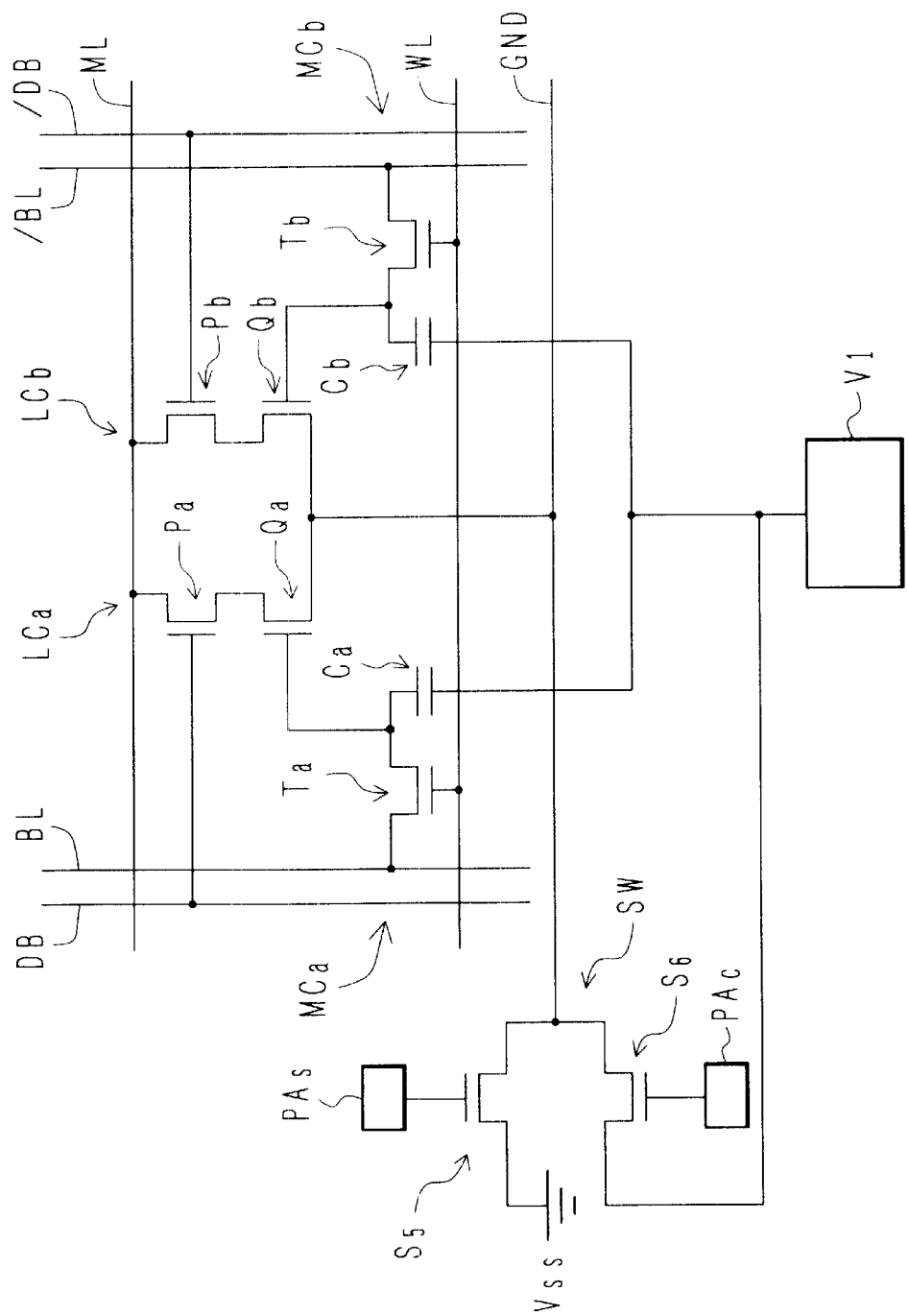
FIG. 16 is an equivalent circuit diagram of a semiconductor device in a second embodiment.

Referring now to FIGS. 15A to 16, description will be given of a second embodiment which can solve the second problem.

FIG. 15A shows a voltage state in an ordinary inspection. The ground potential Vss is applied to the source terminal of the transistor Qa. In the inspection, the transistor Ta is turned on to apply the power source voltage Vcc to the storage electrode of the capacitor Ca to store positive charge. After the charge is stored, the transistor Ta is turned off. The storage of charge sets the transistor Qa to on, and a voltage substantially equal to the power source voltage Vcc is applied between the gate electrode and the channel. Therefore, the gate leakage current lLg flows from the gate electrode to the channel. The gate leakage current lLg is larger than the junction leakage current (the refresh time is shorter) as indicted by the refresh time at temperature $T_1$ shown in FIG. 12. It is consequently difficult to accept or to reject the pertinent element according to the magnitude of the junction leakage current.

Consider that the inspection is conducted by applying the power source voltage Vcc to the source terminal of the transistor Qa as shown in FIG. 15B. In this case, the leakage current from the gate electrode to the channel does not take place. When the junction leakage current lLj is large, the charge stored in the storage electrode of the capacitor Ca is discharged and hence the potential of the gate electrode of the transistor Qa lowers. Then, the leakage current lLg flows from the source region of the transistor Qa to the gate electrode. This leakage current raises again the potential of the storage electrode of the capacitor Ca, and in a state in which the junction leakage current and the gate leakage current are balanced, the potential of the storage electrode is fixed. Therefore, it is difficult to detect the junction leakage current.

FIG. 15C shows a voltage applied state in the inspection of a semiconductor device of the second embodiment. A half of the power source voltage Vcc, i.e., (½)Vcc, is applied to the source terminal of the transistor Qa. When the power source voltage Vcc is applied to the storage electrode of the capacitor Ca and positive charge is stored in the storage electrode, the potential difference between the gate electrode of the transistor Qa and the source region thereof becomes (½)Vcc. In this situation, the drain terminal of the transistor Qa is in the floating state.

When the power source voltage Vcc is 1.8 V, the gate-source voltage of the transistor Qa is 0.9 V. When the gate-source voltage lowers from 1.8 V to 0.9 V, the gate leakage current is reduced by about one order of power as shown in FIG. 11. When the gate leakage current is reduced, the refresh time associated with the gate leakage current is elongated from $Rtg_0$ to $Rtg_1$ in the graph of FIG. 12. Using a judge reference $Rt_1$ at an inspection temperature $T_1$, the cell $C_1$ can be discriminated from the cell $C_2$.

FIG. 16 shows a circuit structure to set the voltage state for the inspection of FIG. 15C. The ground line GND is connected to a voltage switch circuit SW. The voltage switch circuit SW selectively applies the ground potential Vss or one half of the power source voltage Vcc to the ground line GND. The structure of the voltage switch circuit SW will be described.

The ground line GND is connected via a normally-off transistor $S_6$ to a voltage generator $V_1$ to generate a voltage of (½)Vcc. Moreover, the ground line GND is connected via a normally-off transistor $S_5$ to the ground potential Vss. The gate electrodes of the transistors $S_5$ and $S_6$ are respectively connected to pads PAs and PAc.

When voltages are not applied to the pads PAs and PAc, the transistor $S_5$ is on and the transistor $S_6$ is off, and then the ground potential Vss is applied to the ground line GND. To conduct the inspection, voltages are externally applied to the pads PAs and PAc to turn transistor $S_5$ off and transistor $S_6$ on. As a result, the voltage of (½)Vcc can be applied to the ground line GND.

In the description of the second embodiment, (½)Vcc is applied to the source terminal of the transistor Qa in the inspection. However, by setting the source voltage to a value higher than the ground voltage Vss and lower than the power source voltage Vcc, the gate leakage current can be advantageously reduced. For sufficiently reducing the gate leakage current, the source voltage Vs of the transistor Qa is desirably set within a range described below.

When the memory cell MCa is in the H state, the memory cell MCb of FIG. 1A is in the L state. The voltage applied to the source terminal of the transistor Qa is also applied to the source terminal of the transistor Qb. Therefore, when the voltage applied to the source terminal of the transistor Qa approaches Vcc, the gate leakage current of the transistor Qb increases, which causes a drawback. To cope with the drawback, the source voltage of the transistor Qa is desirably higher than Vss and equal to or less than (½)(Vcc−Vss), more favorably, between (¼)(Vcc−Vss) and (½)(Vcc−Vss).

Figure 17A:
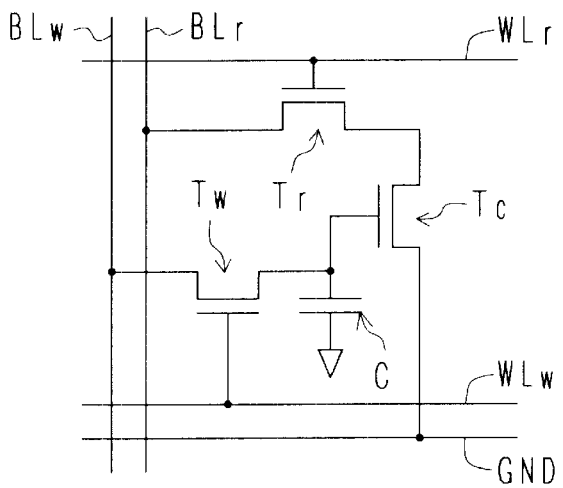
FIGS. 17A to 17C are equivalent circuit diagrams of a semiconductor device in other embodiments.
Figure 17B:
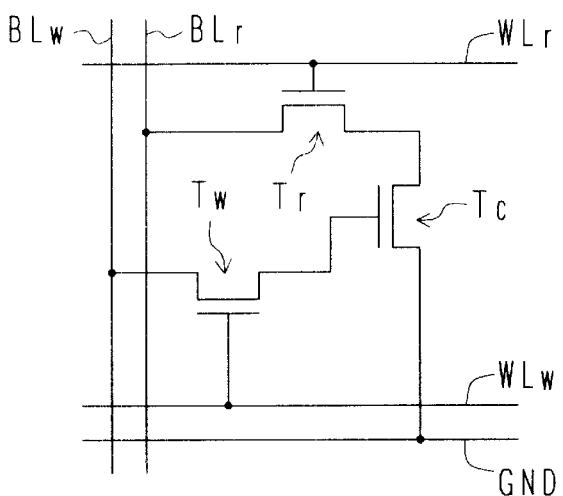
Figure 17C:
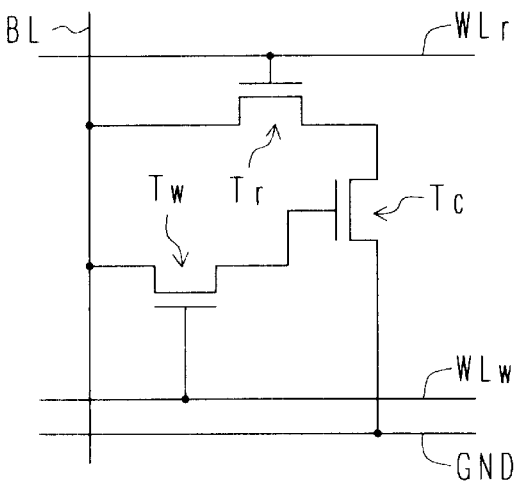

In the first and second embodiment, description has been given of an example of the CAM. However, the first and second problems are not particularly unique to the CAM. These problems also take place in, for example, a semiconductor device in which one of the electrodes of a capacitor is connected to the gate electrode of a transistor and a semiconductor device in which one of the electrodes of a capacitor is connected to the gate electrode and an impurity diffusion region. As an example of such a semiconductor device is a 3-transistor-type DRAM. Referring now to FIGS. 17A to 17C, description will be given of a case in which the technical idea of the first and second embodiment is applied to a DRAM.

FIG. 17A shows a 3-transistor-one-capacitor-type memory cell. A storage electrode of a capacitor C is connected via a write transistor Tw to a write bit line BLw. A gate electrode of the write transistor Tw is connected to a write word line WLw.

The storage electrode of the capacitor C is further connected to a gate electrode of the comparator transistor Tc. One of the source and drain terminals of the comparator transistor Tc is connected to the ground line GND, and other one thereof is connected via a read transistor Tr to a read bit line BLr. A gate electrode of the read transistor Tr is connected to a read word line WLr.

The write transistor Tw, the comparator transistor Tc, and the capacitor C respectively correspond to the transistor Ta, the transistor Qa, and the capacitor Ca. When the voltage applied to the ground line GND is set to Vss+$\beta$ as in the first embodiment of FIGS. 13C and 14, the gate leakage current of the comparator transistor Tc can be reduced. Additionally, when the precharge voltage of the read bit line BLr in the read operation is set to Vss-$\alpha$ as in the first embodiment of FIGS. 13C and 14, the gate leakage current of the comparator transistor Tc can be reduced.

When the potential of the ground line GND at inspection is set to (½)Vcc as in the second embodiment of FIGS. 15C and 16, the defective cell can be detected.

FIG. 17B shows a memory cell of a 3-transistor-type DRAM. The memory cell of FIG. 17B is the same as that shown in FIG. 17A only by removing the capacitor C from that of FIG. 17A. Electrostatic capacitance between the gate electrode of the comparator transistor Tc and the substrate serves as the capacitor C.

In the memory cell of FIG. 17C, the write bit line BLw and the read bit line BLr of FIG. 17B are mutually and commonly used. Also in the cases of FIGS. 17B and 17C, when the potential of the ground line GND, the potential of the read bit line BLr, and the potential of the bit line BL are controlled in almost the same way as the case shown in FIG. 17A, the gate leakage current can be reduced and the defective cell can be detected.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device, comprising:
    a semiconductor substrate;
    a plurality of cells regularly disposed on one surface of said semiconductor substrate, each said cell including a first transistor and a second transistor, each of said first and second transistors including a first current terminal, a second current terminal, and a gate terminal for controlling a conduction state between said first and second terminals, said second current terminal of said first transistor being connected to said gate terminal of said second transistor;
    a bit line connected to said first current terminals of said first transistors of part of said cells;
    a word line connected to said gate terminals of said first transistors of part of said cells;
    a first wiring connected to a point in a circuit connected to said first current terminal of said second transistor of part of said cells;
    a second wiring connected to a point of a circuit connected to said second current terminal of said second transistor of each of cells selected from said cells;
    a bit line driver for setting said bit line to either one of a first voltage state and a second voltage state with a voltage higher than a voltage of the first voltage state;
    a first voltage generator circuit for generating a third voltage on said first wiring, said third voltage being higher than said first voltage and lower than said second voltage;
    a second voltage generator circuit for generating a fourth voltage on said second wiring, said fourth voltage being higher than said third voltage and equal to or lower than said second voltage; and
    a voltage detector circuit for detecting a voltage appearing on said second wiring.

2. A semiconductor device according to claim 1, wherein said first voltage generator circuit includes a first voltage drop circuit interposed between said first wiring and a first fixed potential fixed to said first voltage.

3. A semiconductor device according to claim 1, wherein said fourth voltage is lower than said second voltage.

4. A semiconductor device according to claim 2, wherein said fourth voltage is lower than said second voltage.

5. A semiconductor device according to claim 3, wherein said second voltage generator circuit includes a second voltage drop circuit interposed between said second wiring and a second fixed potential fixed to said second voltage.

6. A semiconductor device according to claim 1, wherein:
    each said cell further includes a capacitor including a first terminal connected to said second current terminal of said first transistor, said semiconductor device further comprising
    a third voltage generator circuit for applying a fixed voltage to a second terminal of said capacitor of each of said cells.

7. A semiconductor device according to claim 2, wherein:
    each said cell further includes a capacitor including a first terminal connected to said second current terminal of said first transistor, said semiconductor device further comprising
    a third voltage generator circuit for applying a fixed voltage to a second terminal of said capacitor of each of said cells.

8. A semiconductor device according to claim 3, wherein:
    each said cell further includes a capacitor including a first terminal connected to said second current terminal of said first transistor, said semiconductor device further comprising
    a third voltage generator circuit for applying a fixed voltage to a second terminal of said capacitor of each of said cells.

9. A semiconductor device according to claim 4, wherein:
    each said cell further includes a capacitor including a first terminal connected to said second current terminal of said first transistor, said semiconductor device further comprising
    a third voltage generator circuit for applying a fixed voltage to a second terminal of said capacitor of each of said cells.

10. A semiconductor device according to claim 1, wherein:
    each said cell further includes a third transistor interposed between said second current terminal of said second transistor and said second wiring or between said first current terminal of said second transistor and said first wiring, said semiconductor device further comprising third wiring connected to a gate electrode of said third transistor of each of part of said cells.

11. A semiconductor device according to claim 2, wherein:
each said cell further includes a third transistor interposed between said second current terminal of said second transistor and said second wiring or between said first current terminal of said second transistor and said first wiring, said semiconductor device further comprising third wiring connected to a gate electrode of said third transistor of each of part of said cells.

12. A semiconductor device according to claim 3, wherein:
each said cell further includes a third transistor interposed between said second current terminal of said second transistor and said second wiring or between said first current terminal of said second transistor and said first wiring, said semiconductor device further comprising third wiring connected to a gate electrode of said third transistor of each of part of said cells.

13. A semiconductor device according to claim 4, wherein:
each said cell further includes a third transistor interposed between said second current terminal of said second transistor and said second wiring or between said first current terminal of said second transistor and said first wiring, said semiconductor device further comprising third wiring connected to a gate electrode of said third transistor of each of part of said cells.

14. A semiconductor device according to claim 5, wherein:
each said cell further includes a third transistor interposed between said second current terminal of said second transistor and said second wiring or between said first current terminal of said second transistor and said first wiring, said semiconductor device further comprising third wiring connected to a gate electrode of said third transistor of each of part of said cells.

15. A semiconductor device according to claim 10, wherein said bit line also serves as said second wiring.

16. A semiconductor device according to claim 10, wherein:
each said cell further includes a fourth transistor, a fifth transistor, and a sixth transistor, said fifth and sixth transistors being connected in series, like said second and third transistors, between said first wiring and said second wiring; said fourth transistor including a second terminal connected to a gate terminal of said fifth transistor, said semiconductor device further comprising:
a reverse bit line connected to a first terminal of said fourth transistor;
a fourth wiring connected to a gate terminal of said sixth transistor; and
a data bus driver for applying mutually complementary signal voltages to said third wiring and said fourth wiring, and wherein
said bit line driver sets said reverse bit line to either one of said first and second voltage states, which state is opposite to the state of said bit line.

17. A semiconductor device, comprising:
a semiconductor substrate;
a first transistor formed on a surface of said semiconductor substrate, said first transistor including a first gate electrode, a first impurity diffusion region, and a second impurity diffusion region; said first and second impurity diffusion regions being formed in a surface layer of said semiconductor substrate respectively on both sides of said first gate electrode;
a signal line for selectively applying either one of a first voltage and a second voltage to said first impurity diffusion region;
a control line for applying a control signal to the first gate electrode of said first transistor, said control signal controlling a conduction state of said first transistor;
a second transistor formed on a surface of said semiconductor substrate, said second transistor including a second gate electrode connected to said second impurity diffusion region, a third impurity diffusion region, and a fourth impurity diffusion region; said third and fourth impurity diffusion regions being formed in a surface layer of said semiconductor substrate respectively on both sides of said second gate electrode; and
a voltage generator circuit for generating, in an ordinary operation, a third voltage on said third impurity diffusion region and for applying, in an inspection, a fourth voltage to said third impurity diffusion region; each of said third and fourth voltages being between said first voltage and said second voltage; a voltage difference between said first and fourth voltages and a voltage difference between said second and fourth voltages are each larger than a smaller one of a voltage difference between said third voltage and said first voltage and a voltage difference between said third voltage and said second voltage.

18. A semiconductor device according to claim 17, further comprising a capacitor, one of the electrodes of which is connected to said second impurity diffusion region, wherein:
said fourth voltage is substantially equal to a mean value of said first and second voltages; and
said voltage generator circuit applies said fourth voltage to other one of the electrodes of said capacitor.

19. A transistor inspection method of inspecting a semiconductor device, said semiconductor device comprising:
a first transistor formed on a surface of a semiconductor substrate, said first transistor including a first gate electrode, a first impurity diffusion region, and a second impurity diffusion region; said first and second impurity diffusion regions being formed in a surface layer of said semiconductor substrate respectively on both sides of said first gate electrode; and
a second transistor formed on a surface of said semiconductor substrate, said second transistor including a second gate electrode connected to said second impurity diffusion region, a third impurity diffusion region, and a fourth impurity diffusion region; said third and fourth impurity diffusion regions being formed in a surface layer of said semiconductor substrate respectively on both sides of said second gate electrode, wherein
data are stored by storing charge via said first transistor to a gate electrode of said second transistor to set a voltage of said gate electrode of said second transistor to a first voltage or a second voltage, said semiconductor inspection method comprising the steps of:
applying a voltage between said first voltage and said second voltage to said third impurity diffusion region of said second transistor and setting said fourth impurity diffusion region to a floating state;
storing charge to said gate electrode of said second transistor via said first transistor to set said gate electrode to said first voltage; and
inspecting a retention characteristic of charge stored in said gate electrode of said second transistor.

20. A semiconductor device, comprising:

a semiconductor substrate;

a plurality of cells regularly disposed on one surface of said semiconductor substrate, each said cell including a first transistor and a second transistor, each of said first and second transistors including a first current terminal, a second current terminal, and a gate terminal for controlling a conduction state between said first and second terminals, said second current terminal of said first transistor being connected to said gate terminal of said second transistor;

a bit line connected to said first current terminals of said first transistors of part of said cells;

a word line connected to said gate terminals of said first transistors of part of said cells;

a first wiring connected to a point in a circuit connected to said first current terminal of said second transistor of part of said cells;

a second wiring connected to a point in a circuit connected to said second current terminal of said second transistor of part of said cells;

a bit line driver for setting said bit line to either one of a first voltage state and a second voltage state with a voltage higher than a voltage of the first voltage state;

a first voltage generator circuit for generating a third voltage on said first wiring, said third voltage being higher than said first voltage and lower than said second voltage;

a second voltage generator circuit for generating a fourth voltage on said second wiring, said fourth voltage being higher than said third voltage and lower than said second voltage; and a voltage detector circuit for detecting a voltage appearing on said second wiring.

* * * * *